US010424729B2

(12) United States Patent
Liu et al.

(10) Patent No.: US 10,424,729 B2
(45) Date of Patent: Sep. 24, 2019

(54) RESISTIVE MEMORY ARCHITECTURES WITH MULTIPLE MEMORY CELLS PER ACCESS DEVICE

(71) Applicant: Ovonyx MemoryTechnology, LLC, Alexandria, VA (US)

(72) Inventors: Jun Liu, Boise, ID (US); Michael P. Violette, Boise, ID (US)

(73) Assignee: Ovonyx Memory Technology, Inc., Alexandria, VA (US)

( * ) Notice: Subject to any disclaimer, the term of this patent is extended or adjusted under 35 U.S.C. 154(b) by 0 days.

(21) Appl. No.: 15/976,462

(22) Filed: May 10, 2018

(65) Prior Publication Data
US 2018/0337330 A1 Nov. 22, 2018

Related U.S. Application Data

(60) Continuation of application No. 15/266,859, filed on Sep. 15, 2016, now Pat. No. 9,997,701, which is a
(Continued)

(51) Int. Cl.
H01L 45/00 (2006.01)
G11C 13/00 (2006.01)
H01L 27/24 (2006.01)

(52) U.S. Cl.
CPC ........ H01L 45/1253 (2013.01); G11C 13/003 (2013.01); G11C 13/0004 (2013.01); G11C 13/0023 (2013.01); G11C 13/0026 (2013.01); H01L 27/2409 (2013.01); H01L 27/2436 (2013.01); H01L 27/2472 (2013.01); H01L 27/2481 (2013.01); H01L 45/06 (2013.01);
(Continued)

(58) Field of Classification Search
CPC ................. H01L 27/2409; H01L 27/2436
See application file for complete search history.

(56) References Cited

U.S. PATENT DOCUMENTS 5,654,235 A * 8/1997 Matsumoto ........... H01L 23/485
438/643
5,866,947 A * 2/1999 Wang ................ H01L 21/76843
257/748
(Continued)

FOREIGN PATENT DOCUMENTS

EP 1306852 A2 5/2003
JP 2002170374 A 6/2002
(Continued)

OTHER PUBLICATIONS

Hudgens et al., "Overview of Phase-Change Chalcogenide Non-volatile Memory Technology," MRS Bulletin, Nov. 2004, pp. 829-832.
(Continued)

Primary Examiner — Allison Bernstein
(74) Attorney, Agent, or Firm — Holland & Hart LLP

(57) ABSTRACT

A resistive memory structure, for example, phase change memory structure, includes one access device and two or more resistive memory cells. Each memory cell is coupled to a rectifying device to prevent parallel leak current from flowing through non-selected memory cells. In an array of resistive memory bit structures, resistive memory cells from different memory bit structures are stacked and share rectifying devices.

7 Claims, 43 Drawing Sheets

Related U.S. Application Data continuation of application No. 14/617,377, filed on Feb. 9, 2015, now Pat. No. 9,472,755, which is a division of application No. 13/292,884, filed on Nov. 9, 2011, now Pat. No. 8,976,562, which is a continuation of application No. 12/656,720, filed on Feb. 16, 2010, now Pat. No. 8,076,195, which is a division of application No. 11/806,495, filed on May 31, 2007, now Pat. No. 7,684,227.

(52) U.S. Cl.
CPC ........ *H01L 45/1233* (2013.01); *H01L 45/144* (2013.01); *G11C 2213/72* (2013.01); *G11C 2213/74* (2013.01); *G11C 2213/76* (2013.01); *G11C 2213/78* (2013.01); *G11C 2213/79* (2013.01)

(56) References Cited

U.S. PATENT DOCUMENTS

| | | | |
|---|---|---|---|
| 6,225,222 B1 * | 5/2001 | Yang | H01L 21/76843 257/E21.584 |
| 6,456,524 B1 | 9/2002 | Perner et al. | |
| 6,521,956 B1 * | 2/2003 | Lee | H01L 21/28525 257/382 |
| 6,943,395 B2 | 9/2005 | Oh et al. | |
| 7,030,456 B2 | 4/2006 | Arai et al. | |
| 7,068,533 B2 | 6/2006 | Ferrant et al. | |
| 7,106,623 B2 | 9/2006 | Huang et al. | |
| 7,145,790 B2 | 12/2006 | Kang | |
| 7,215,568 B2 | 5/2007 | Liaw et al. | |
| 7,236,393 B2 | 6/2007 | Cho et al. | |
| 7,291,878 B2 | 11/2007 | Stipe | |
| 7,436,704 B2 | 10/2008 | Kim et al. | |
| 7,440,308 B2 | 10/2008 | Jeong et al. | |
| 7,447,062 B2 | 11/2008 | Burr et al. | |
| 7,450,415 B2 | 11/2008 | Kim et al. | |
| 7,502,252 B2 | 3/2009 | Fuji et al. | |
| 7,660,144 B2 | 2/2010 | Bhattacharyya | |
| 7,728,350 B2 | 6/2010 | Bhattacharyya | |
| 7,800,091 B2 | 9/2010 | Kamigaichi et al. | |
| 7,869,257 B2 | 1/2011 | Philipp et al. | |
| 7,885,098 B2 | 2/2011 | Ro et al. | |
| 7,968,402 B2 | 6/2011 | Bhattacharyya | |
| 8,125,003 B2 | 2/2012 | Bhattacharyya | |
| 8,283,651 B2 | 10/2012 | Choi et al. | |
| 8,462,538 B2 | 6/2013 | Tsukada | |
| 9,029,829 B1 | 5/2015 | Echevery et al. | |
| 2006/0139989 A1 | 6/2006 | Gruning Von Schwerin et al. | |
| 2011/0199813 A1 | 8/2011 | Yoo | |

FOREIGN PATENT DOCUMENTS

| | | |
|---|---|---|
| JP | 2006351779 A | 12/2006 |
| JP | 2007073176 A | 3/2007 |
| WO | WO 9641381 | 12/1996 |
| WO | WO 2005098952 A1 | 10/2005 |

OTHER PUBLICATIONS

International Search Report and Written Opinion of the International Searching Authority, Int'l. Appl. No. PCT/US2008/060592; dated Mar. 24, 2009, European Patent Office, Rijswijk, NL, 15 pgs.

Lankhorst et al., "Low-cost and nanoscale non-volatile memory concept for future silicon chips," Nature Materials, vol. 4, Apr. 2005, pp. 347-352.

* cited by examiner

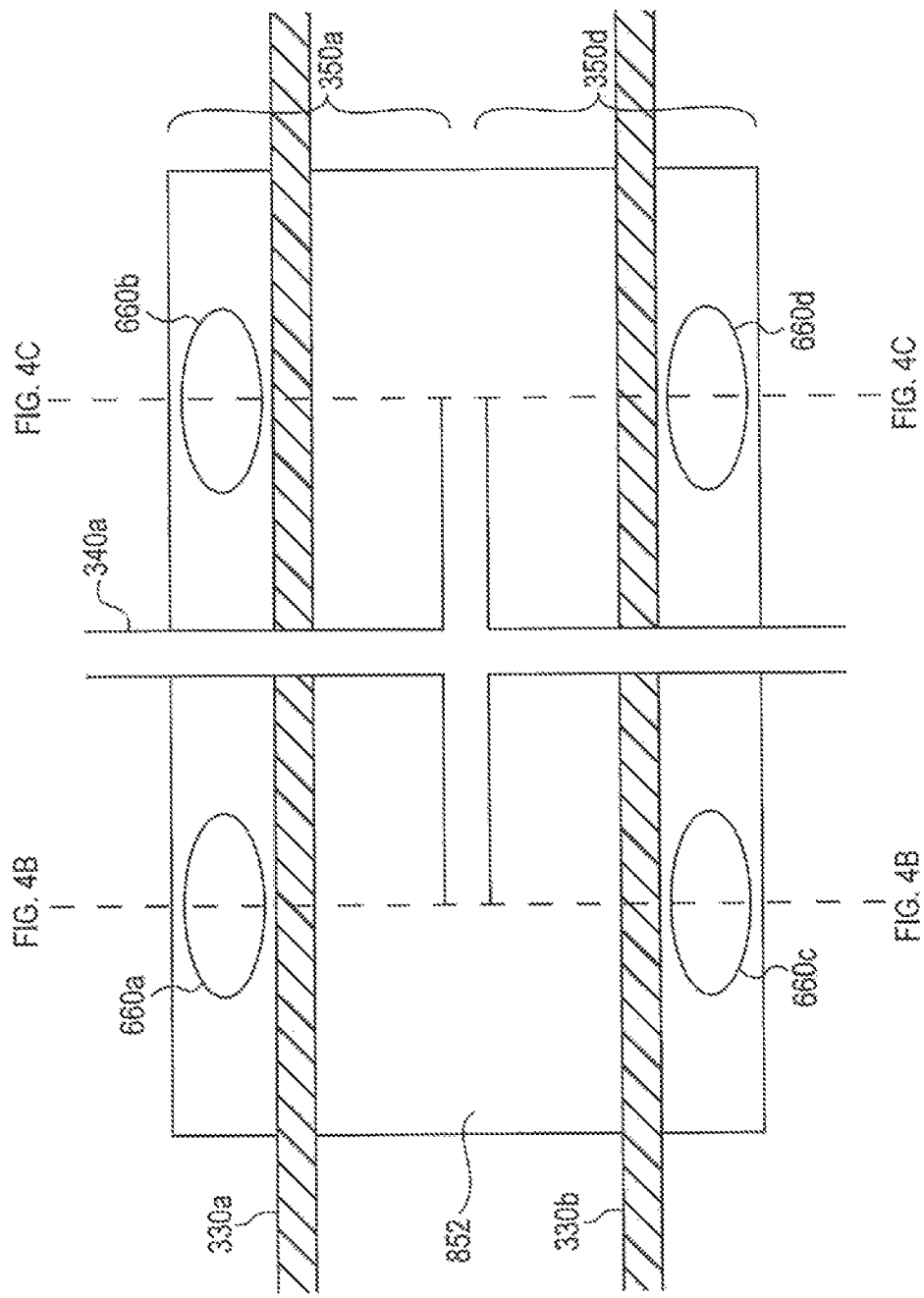

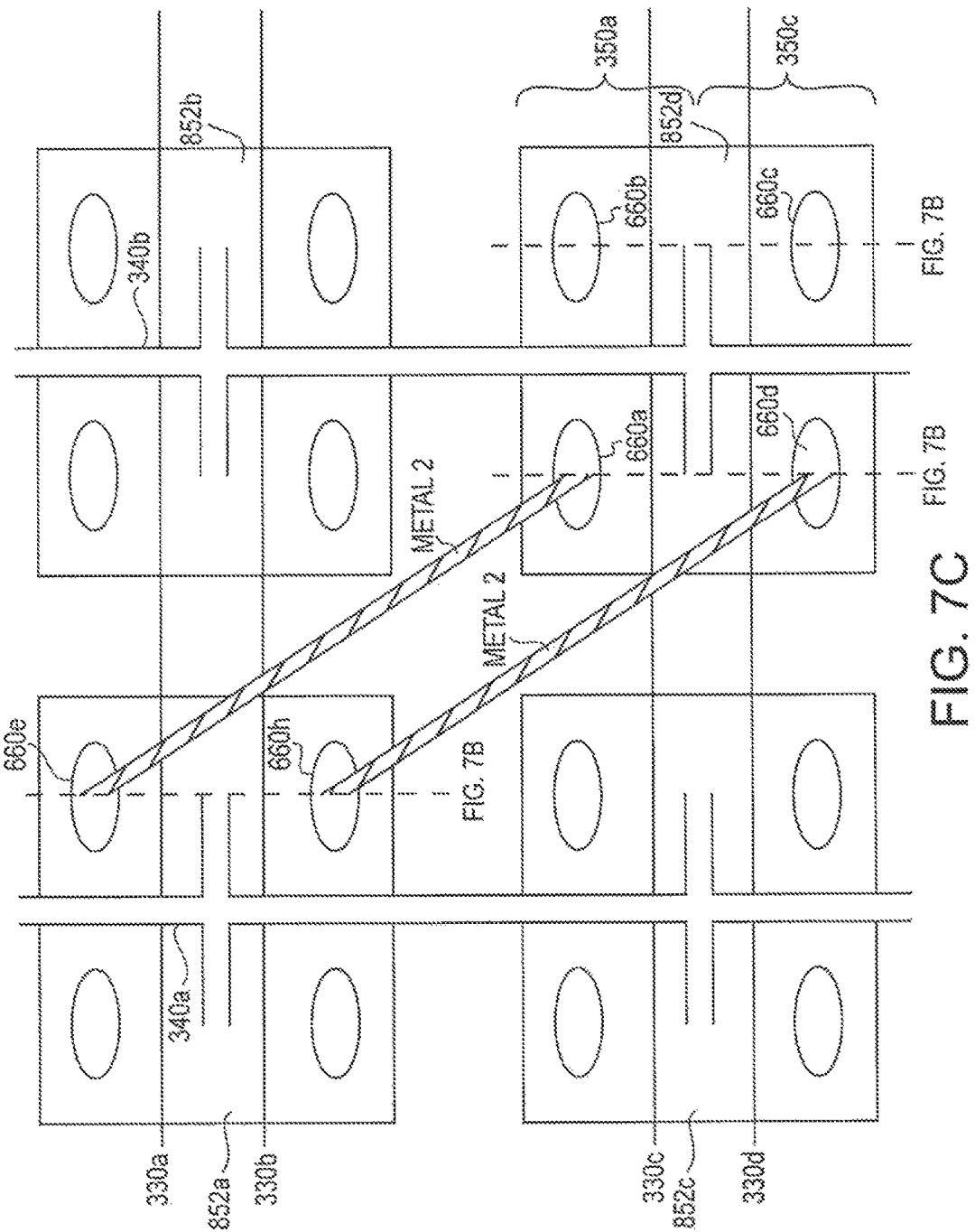

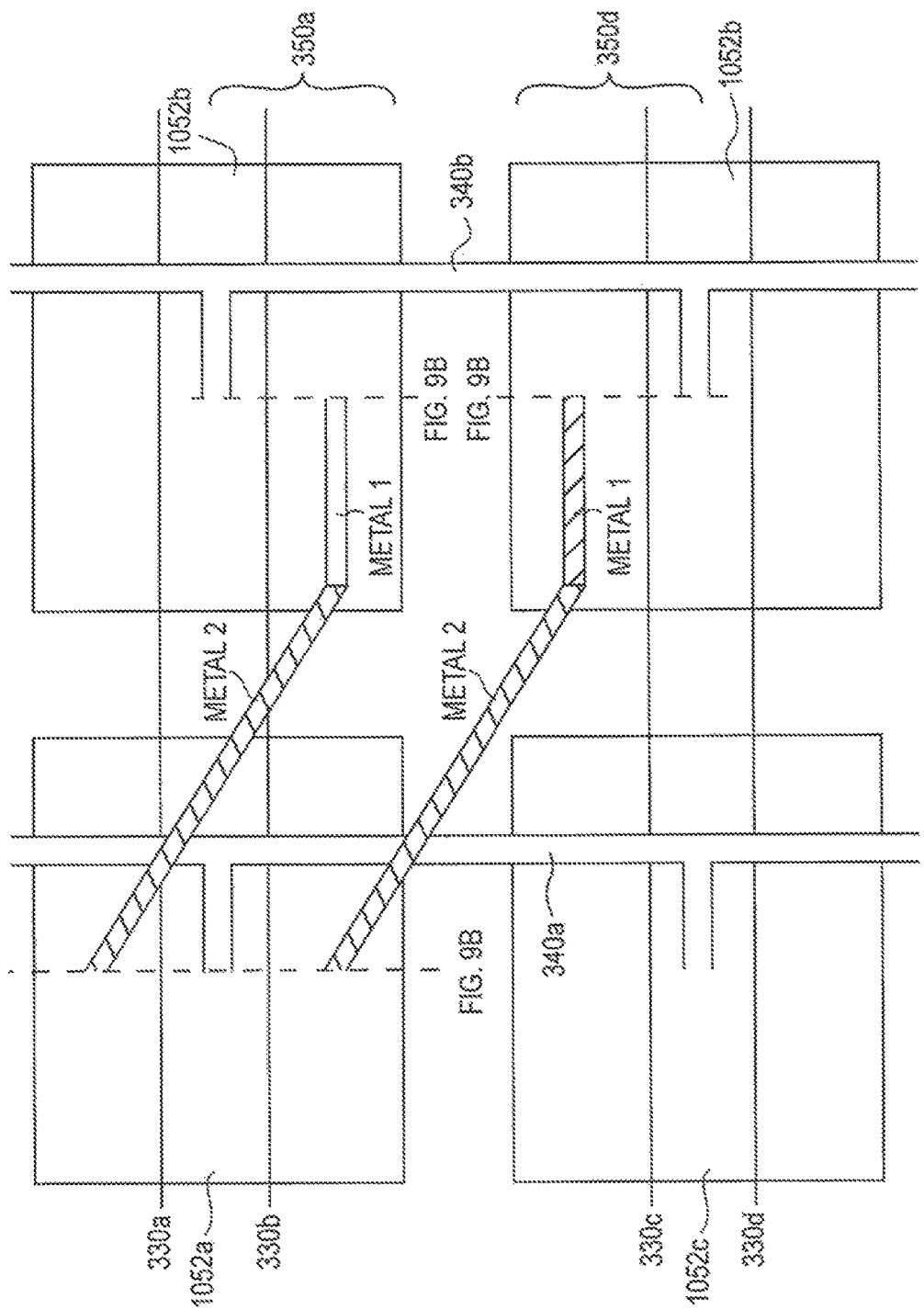

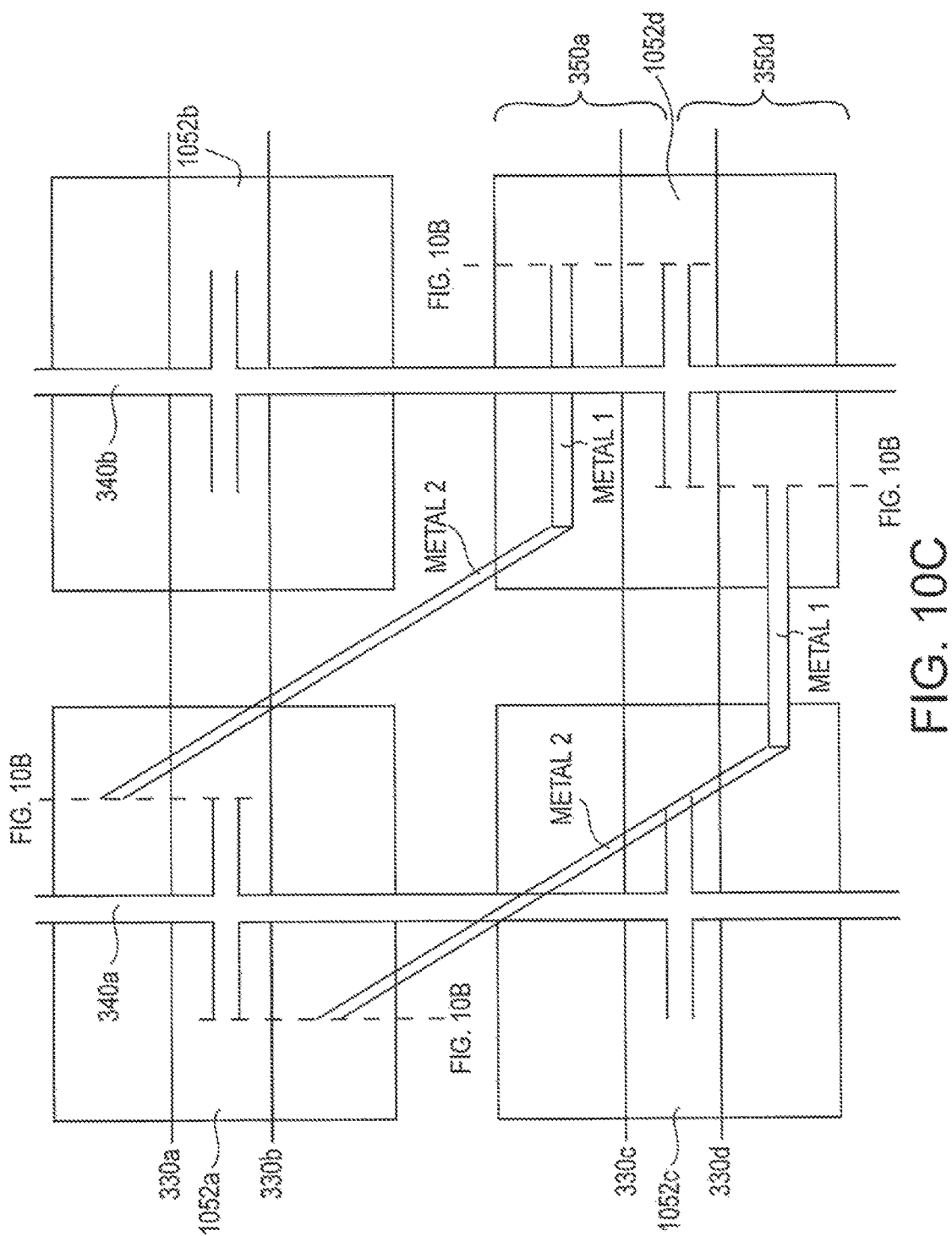

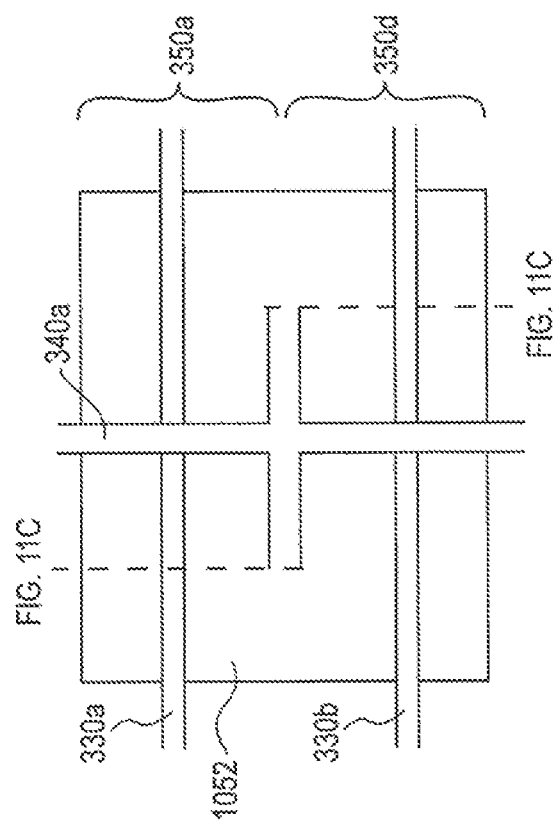

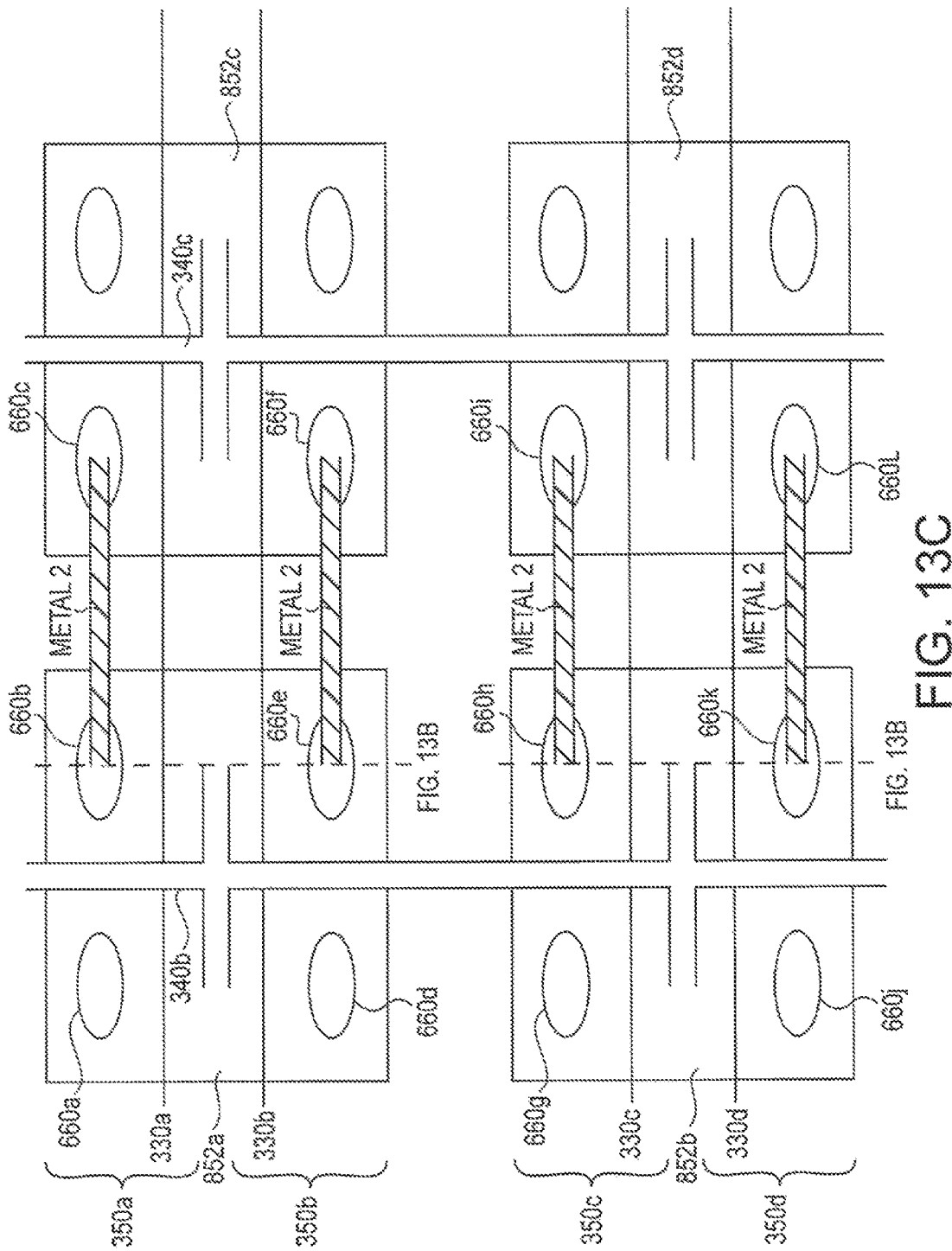

RESISTIVE MEMORY ARCHITECTURES WITH MULTIPLE MEMORY CELLS PER ACCESS DEVICE

CROSS REFERENCES

The present Application for Patent is a continuation application of U.S. patent application Ser. No. 15/266,859 by Liu et al., entitled "Resistive Memory Architectures With Multiple Memory Cells Per Access Device," filed Sep. 15, 2016, which is a continuation application of U.S. patent application Ser. No. 14/617,377 by Liu et al., entitled "Resistive Memory Architectures With Multiple Memory Cells Per Access Device," filed Feb. 9, 2015, which is a divisional application of U.S. patent application Ser. No. 13/292,884 by Liu et al., entitled "Resistive Memory Architectures With Multiple Memory Cells Per Access Device," filed Nov. 9, 2011, which is a continuation application of U.S. patent application Ser. No. 12/656,720 by Liu et al., entitled "Resistive Memory Architectures With Multiple Memory Cells Per Access Device," filed Feb. 16, 2010, which is a divisional application of U.S. patent application Ser. No. 11/806,495 by Liu et al., entitled "Resistive Memory Architectures With Multiple Memory Cells Per Access Device," filed May 31, 2007, assigned to the assignee hereof, and expressly incorporated by reference in its entirety herein.

FIELD OF THE INVENTION

The embodiments of the invention relate generally to the field of semiconductor devices and, more particularly, to resistive memory devices, e.g., phase change memory devices.

BACKGROUND OF THE INVENTION

Microprocessor-accessible memory devices have traditionally been classified as either non-volatile or volatile memory devices. Non-volatile memory devices are capable of retaining stored information even when power to the memory device is turned off. Traditionally, however, non-volatile memory devices occupy a large amount of space and consume large quantities of power, making these devices unsuitable for use in portable devices or as substitutes for frequently-accessed volatile memory devices. On the other hand, volatile memory devices tend to provide greater storage capability and programming options than non-volatile memory devices. Volatile memory devices also generally consume less power than non-volatile devices. However, volatile memory devices require a continuous power supply in order to retain stored memory content.

Research and development of commercially viable memory devices that are randomly accessed, have relatively low power consumption, and are non-volatile is ongoing. One ongoing area of research is in resistive memory cells where resistance states can be programmably changed. One avenue of research relates to devices that store data in memory cells by structurally or chemically changing a physical property of the memory cells in response to applied programming voltages, which in turn change cell resistance. Examples of variable resistance memory devices being investigated include memories using variable resistance polymers, perovskite, doped amorphous silicon, phase-changing glasses, and doped chalcogenide glass, among others.

FIG. 1 shows a basic composition of a typical variable resistance memory cell such as a phase change memory cell 10 constructed over a substrate 12, having a variable resistance material, e.g., a phase change material 16 formed between a bottom electrode 14 and a top electrode 18. One type of variable resistance material may be amorphous silicon doped with V, Co, Ni, Pd, Fe and Mn as disclosed in U.S. Pat. No. 5,541,869 to Rose et al. Another type of variable resistance material may include perovskite materials such as $Pr_{(1-x)}Ca_xMnO_3$ (PCMO), $La_{(1-x)}Ca_xMnO_3$ (LCMO), $LaSrMnO_3$ (LSMO), $GdBaCo_xO_y$, (GBCO) as disclosed in U.S. Pat. No. 6,473,332 to Ignatiev et al. Still another type of variable resistance material may be a doped chalcogenide glass of the formula $A_xB_y$, where "B" is selected from among S, Se and Te and mixtures thereof, and where "A" includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At) of the periodic table, and with the dopant being selected from among the noble metals and transition metals, including Ag, Au, Pt, Cu, Cd, Ir, Ru, Co, Cr, Mn or Ni, as disclosed in U.S. Pat. Nos. 6,881,623 and 6,888,155 to Campbell et al. and Campbell, respectively. Yet another type of variable resistance material includes a carbon-polymer film comprising carbon black particulates or graphite, for example, mixed into a plastic polymer, such as that disclosed in U.S. Patent No. 6,072,716 to Jacobson et al. The material used to form the electrodes 14, 18 can be selected from a variety of conductive materials, such as tungsten, nickel, tantalum, titanium, titanium nitride, aluminum, platinum, or silver, among others.

Much research has focused on memory devices using memory elements composed of chalcogenides. Chalcogenides are alloys of Group VI elements of the periodic table, such as Te or Se. A specific chalcogenide currently used in rewriteable compact discs ("CD-RWs") is $Ge_2Sb_2Te_5$. In addition to having valuable optical properties that are utilized in CD-RW discs, $Ge_2Sb_2Te_5$ also has desirable physical properties as a variable resistance material. Various combinations of Ge, Sb and Te may be used as variable resistance materials and which are herein collectively referred to as GST materials. Specifically, GSTs can change structural phases between an amorphous phase and two crystalline phases. The resistance of the amorphous phase ("a-GST") and the resistances of the cubic and hexagonal crystalline phases ("c-GST" and "h-GST," respectively) can differ significantly. The resistance of amorphous GST is greater than the resistances of either cubic GST or hexagonal GST, whose resistances are similar to each other. Thus, in comparing the resistances of the various phases of GST, GST may be considered a two-state material (amorphous GST and crystalline GST), with each state having a different resistance that can be equated with a corresponding binary state. A variable resistance material such as GST whose resistance changes according to its material phase is referred to as a phase change material.

The transition from one GST phase to another occurs in response to temperature changes of the GST material. The temperature changes, i.e., the heating and cooling, can be caused by passing differing amounts of current through the GST material. The GST material is placed in a crystalline state by passing a crystallizing current through the GST material, thus warming the GST material to a temperature wherein a crystalline structure may grow. A stronger melting current is used to melt the GST material for subsequent cooling to an amorphous state. As the typical phase change memory cell uses the crystalline state to represent one logical state binary, e.g., "1," and the amorphous state to represent another logical state binary, e.g., "0," the crystallizing current is referred to as a set current 'SET and the melting current is referred to as an erase or reset current $I_{RST}$. One skilled in the art will understand, however, that the assignment of GST states to binary values may be switched if desired. The set currents $I_{SET}$ and the erase or reset currents $I_{RST}$ are typically large, often in the order of a few hundred microamps.

A typical resistive memory bit structure such as a phase change memory bit structure 315 that incorporates a phase change memory cell 10, for example, is represented schematically in FIG. 2A. In FIG. 2A, the memory cell 10 is connected to a cell select line 320 via either the cell's top or bottom electrode. The opposing electrode is connected to an access device 350 such as an access transistor. The access device 350 is gated by a word line 330. A bit line 340 provides a source to the access device 350 and is connected to the memory cell 10 when the access device 350 is activated by the word line 330. The access device 350 must be sufficiently large in order to pass the large phase changing currents $I_{SET}$ and $I_{RST}$ to the memory cell 10.

The memory bit structure 315 of FIG. 2A may be arranged into an array of memory bit structures, as illustrated in FIG. 2B. In FIG. 2B, a conventional resistive memory device 400 includes an array of memory bit structures 315a-315h. The memory bit structures 315a-315h are arranged in rows and columns. The rows and columns may be partially staggered, as in FIG. 2B, or may be aligned in parallel. The memory bit structures 315a-315h along any given cell select line 320a-320d do not share a common word line 330a-330d. Additionally, the memory bit structures 315a-315h along any given word line 330a-330d do not share a common bit line 340a-340d. In this manner, each memory bit structure is uniquely identified by the combined selection of the word line to which the gate of the memory cell access device 350a-350h is connected, and the cell select line to which the memory cell is connected.

Each word line 330a-330d is connected to a word line driver in the form of a row decoder 460 for selecting the respective word line for an access operation. Similarly, each cell select line 320a-320d is coupled to a driver in the form of a column decoder 450.

For simplicity, FIG. 2B illustrates a memory array having only four rows of memory bit structures 315 on four cell select lines 320a-320d and four columns of memory bit structures 315 on four word lines 330a-330d. However, it should be understood that in practical applications, the memory device 400 has significantly more memory bit structures in an array. For example, an actual memory device may include several million memory bit structures 315 arranged in a number of subarrays.

Significantly, FIGS. 2A and 2B illustrate how each memory cell 10 is connected to a separate and individual access device 350. As was described above, in resistive memory cells such as the phase change memory cells 10, the amount of current necessary to change at least a portion of the phase change material 16 into an amorphous state is relatively high (generally a few hundred microamps). As a result, the access device 350 for each memory cell 10 is correspondingly large. In a conventional phase change memory bit structure with a one-to-one correspondence between memory cells and access devices, the typical memory bit area is 16 $F^2$, meaning an area equal to 16 $F^2$, where F is the fabrication resolution. Because of continued desire to reduce the overall footprint of memory bit structures, there is a need to reduce the footprint of resistive memory bit structures, e.g., phase change memory bit structures.

BRIEF DESCRIPTION OF THE DRAWINGS

FIGS. 4A, 4B, 4C and 4D are schematic and physical representations of a phase change memory bit structure and a corresponding memory device according to a disclosed embodiment.

FIGS. 7A, 7B and 7C are schematic and physical representations of a phase change memory bit structure and a corresponding memory device according to a disclosed embodiment.

FIGS. 9A, 9B and 9C are schematic and physical representations of a phase change memory bit structure and a corresponding memory device according to a disclosed embodiment.

FIGS. 10A, 10B and 10C are schematic and physical representations of a phase change memory bit structure and a corresponding memory device according to a disclosed embodiment.

FIGS. 11A, 11B, 11C and 11D are schematic and physical representations of a phase change memory bit structure and a corresponding memory device according to a disclosed embodiment.

FIGS. 13A, 13B and 13C are schematic and physical representations of a phase change memory bit structure and a corresponding memory device according to a disclosed embodiment.

DETAILED DESCRIPTION OF THE INVENTION

Figure 1:
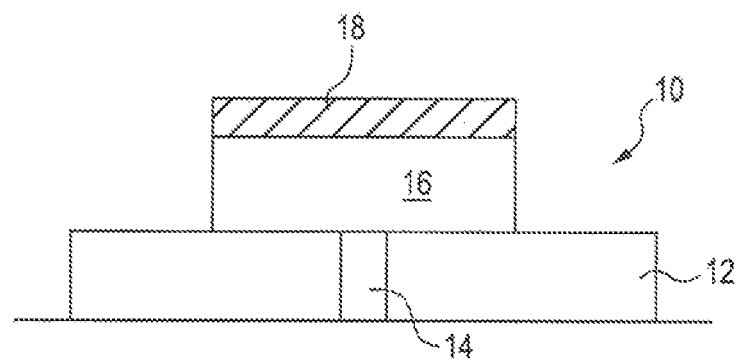
FIG. 1 illustrates a typical phase change memory cell.
Figure 2A:
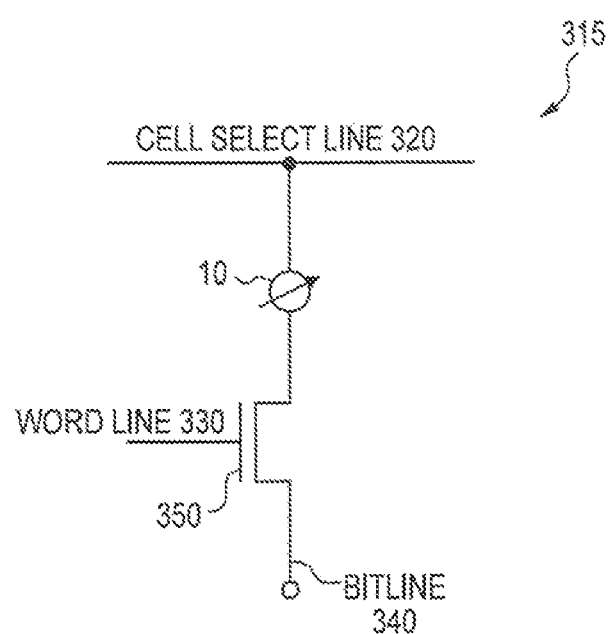
FIGS. 2A, 2B and 2C are schematic and physical representations of a phase change memory bit structure and a corresponding memory device.
Figure 2B:
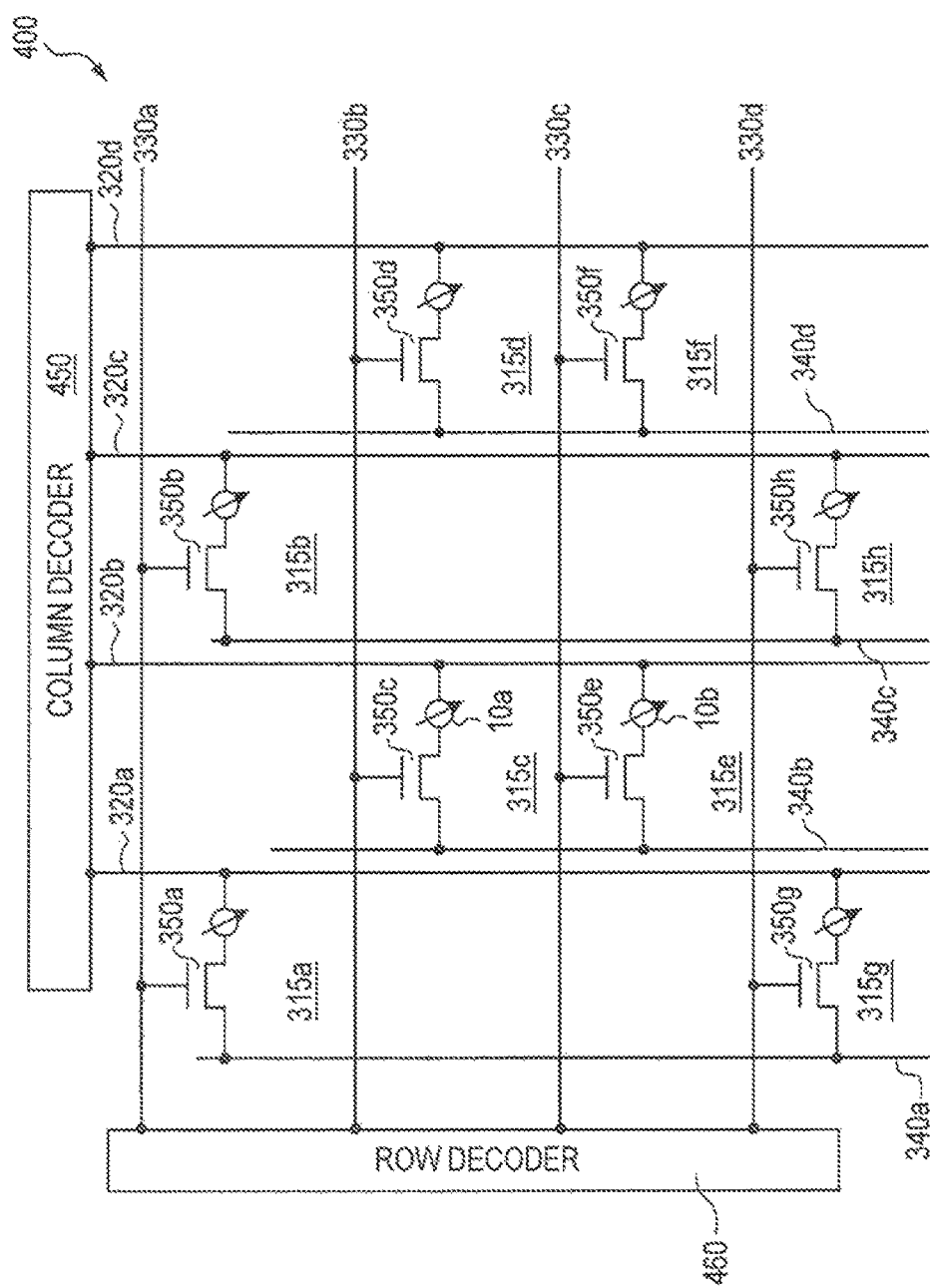
Figure 2C:
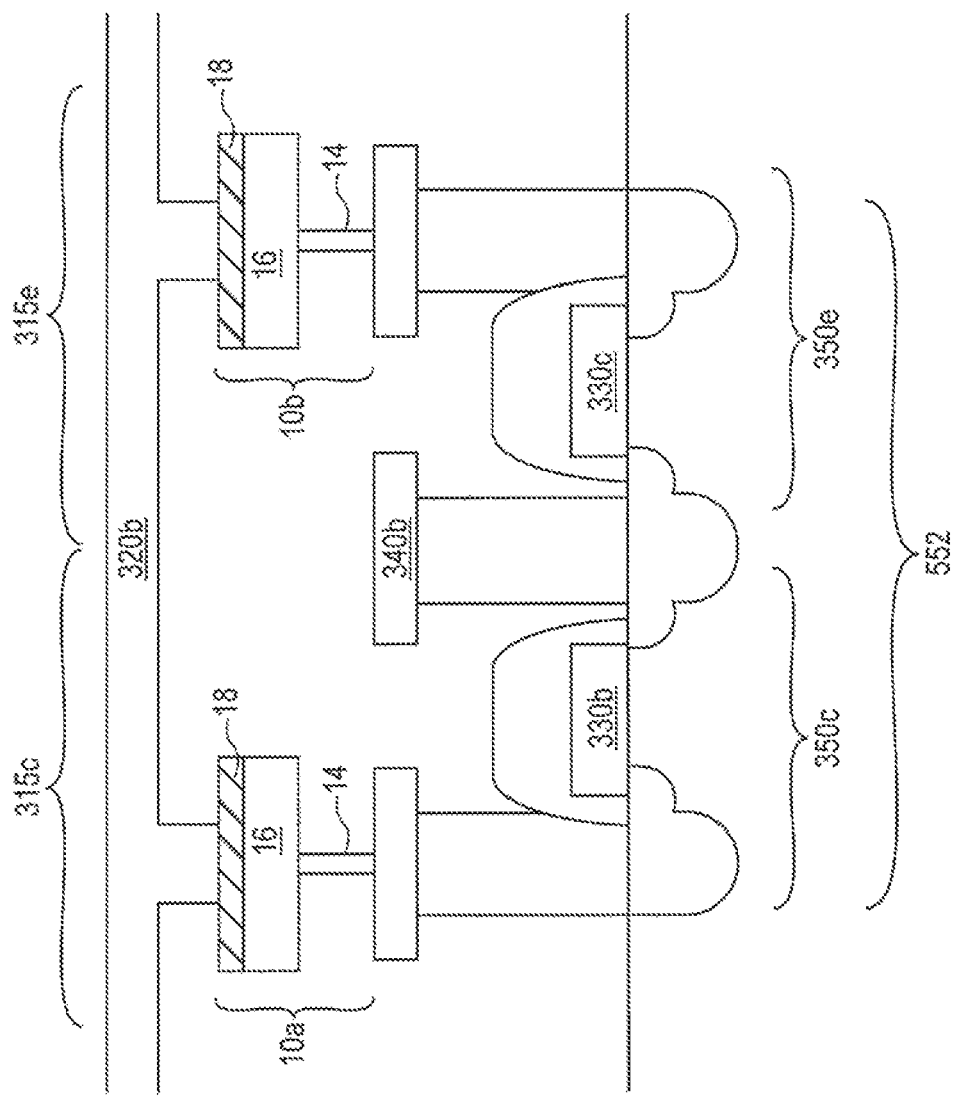

The large current requirements in variable resistance memory cells result in large access devices. When a variable resistance memory bit structure has a one-to-one pairing of memory cells to access devices, the memory bit structure has a large footprint. An example of the physical structure of a one-to-one memory cell to access device pairing is shown in FIG. 2C, which relates to portions of memory device 400 (FIG. 2B). In FIG. 2C, a cross-sectional view of the physical organization of two conventional memory bit structures 315c, 315e is depicted. The memory bit structures 315c, 315e share the same cell select line 320b and bit line 340b. Each memory bit structure 315c, 315e in FIG. 2C includes a memory cell 10a, 10b, respectively, that each include a top electrode 18, a bottom electrode 14, and a phase change region 16 positioned in between the electrodes 14, 18. The top electrode 18 of both memory cells 10a, 10b is connected to the cell select line 320b. The bottom electrode 14 of each memory cell 10a, 10b is connected to the drains of separate and individual access devices 350c, 350e. The opposing sources of the access devices 350c, 350e are connected to a shared bit line 340b. The access devices 350c, 350e are gated by separate word lines 330b, 330c, which form gates of access devices 350c, 350e.

Generally, the two access devices 350c, 350e are located in a single active area 552 of the memory device 400. Other pairs of access devices are located in neighboring active areas 552. Active areas 552 are regions of device 400 that have been doped so as to allow formation of one or more access devices 350, such as transistors. Because the current demands of resistive memory cells 10 are relatively high, the size of the access devices 350, and hence the size of the active areas 552 are correspondingly large.

The large access devices and active areas have the potential to result in large memory bit structure footprints and sparsely populated memory devices, as illustrated in FIG. 2B. An improved resistive memory bit structure with a reduction in the memory bit structure footprint would allow the fabrication of denser resistive memory devices.

Figure 3:
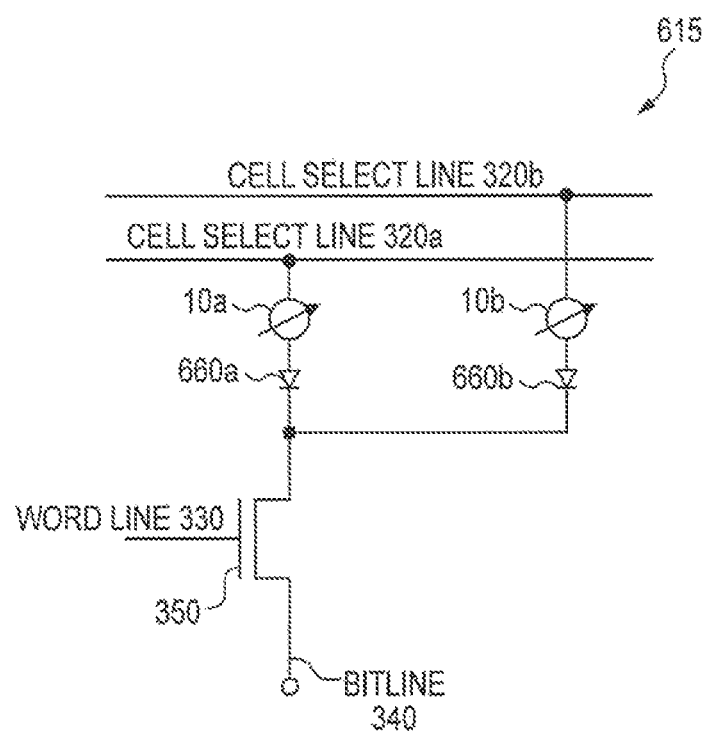
FIG. 3 is a schematic representation of a phase change memory bit structure according to a disclosed embodiment.

Embodiments of the invention are now disclosed which provide different ways of reducing the resistive memory bit structure footprint. One method of reducing the area required by a phase change memory bit structure and yet still utilizing an access device large enough for the phase-changing currents used in a phase change memory cell is to use more than one memory cell per access device. For example, FIG. 3 illustrates a phase change memory bit structure 615 that incorporates two phase change memory cells 10a, 10b. Memory cells 10a, 10b are both coupled to an access device 350 such as a transistor. Each memory cell 10a, 10b is also connected to a separate cell select line 320a, 320b. As in the typical phase change memory bit structure 315 of FIG. 2A, the access device 350 is gated by a word line 330. A bit line 340 provides a source to the access device 350 and is connected to the memory cells 10a, 10b when the access device 350 is activated by the word line 330 and when one of the memory cells 10a, 10b is selected by the corresponding cell select line 320a, 320b, respectively.

The memory bit structure 615 also includes two rectifying devices 660a, 660b such as, for example, diodes. The rectifying devices 660a, 660b are each serially connected between the corresponding memory cells 10a, 10b and the access device 350. The rectifying devices 660a, 660b prevent parallel leakage current among the memory cells 10a, 10b. In other words, when memory cell 10a is selected by activation of both the cell select line 320a and word line 330, the resultant current that flows through memory cell 10a is prevented from flowing through memory cell 10b by rectifying device 660b. As will be explained below, the rectifying devices 660a, 660b may be integrated into the drain regions of the access device 350 when access device 350 is a transistor, or may be separate devices.

Figure 4A:
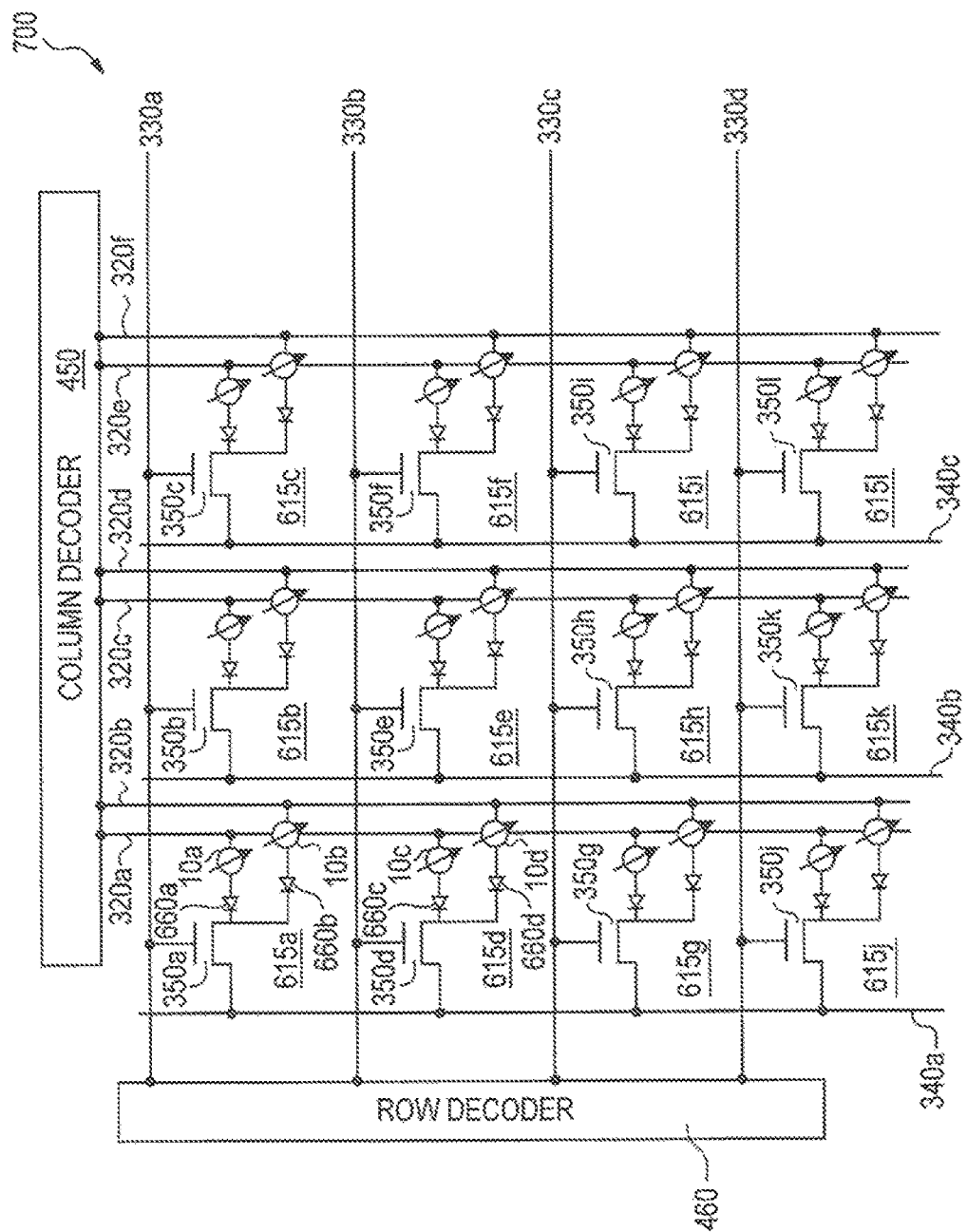

Multiple memory bit structures 615 may be organized into an array. FIG. 4A illustrates a memory device 700 in which memory bit structures 615a-615l are organized as parallel structures (as opposed to the staggered arrangement illustrated in FIG. 2B). As in the memory device depicted in FIG. 2B, device 700 includes word lines 330a-330d, each connected to a word line driver in the form of a row decoder 460 for selecting the respective word line for an access operation. Similarly, device 700 includes cell select lines 320a-320f which are each coupled to a driver in the form of a column decoder 450. For each memory bit structure, two cell select lines and one word line are required, since each memory bit structure includes two memory cells. For example, in FIG. 4A, memory bit structure 615d is connected to both cell select lines 320a and 320b as well as to the word line 330b. In order to select memory cell 110c, for example, cell select line 320a and word line 330b must both be activated. The current passing through the selected memory cell 10c may then be measured by sense amplifiers (not shown), in the case of a read operation. In the case of a write operation, a stronger programming current is applied to the memory cell. A write operation for memory cell 10c is done by selecting memory cell 10c through activation of both the cell select line 320a and the word line 330b. A voltage differential between the cell select line 320a and the bit line 340a sufficient to generate a current to program the memory cell 10c is created. The voltage differential may be created by altering the voltages of either the cell select line 320a or the bit line 340a, or through some combination. Generally, the bit lines 340a-340c are either tied to ground or to a fixed voltage, though they may be individually addressed.

Figure 4B:
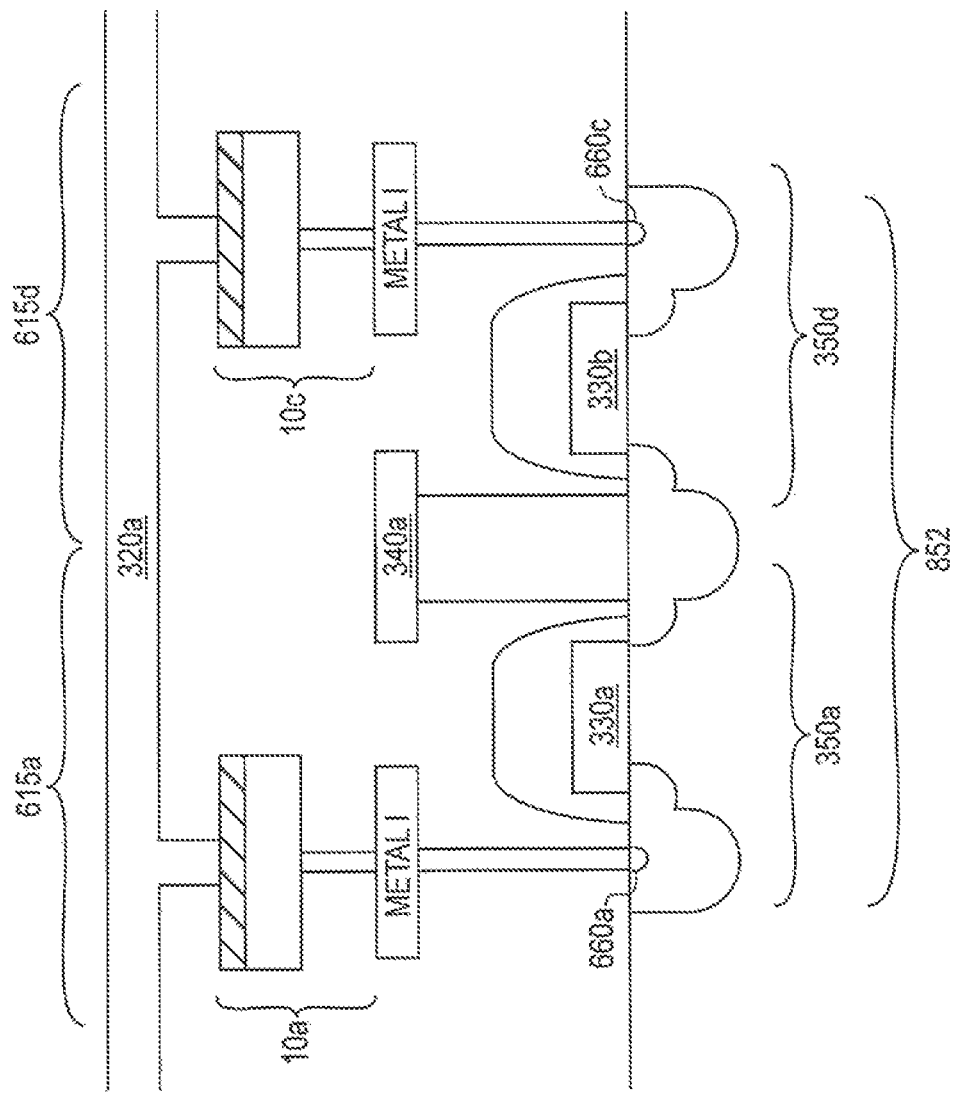
Figure 4C:
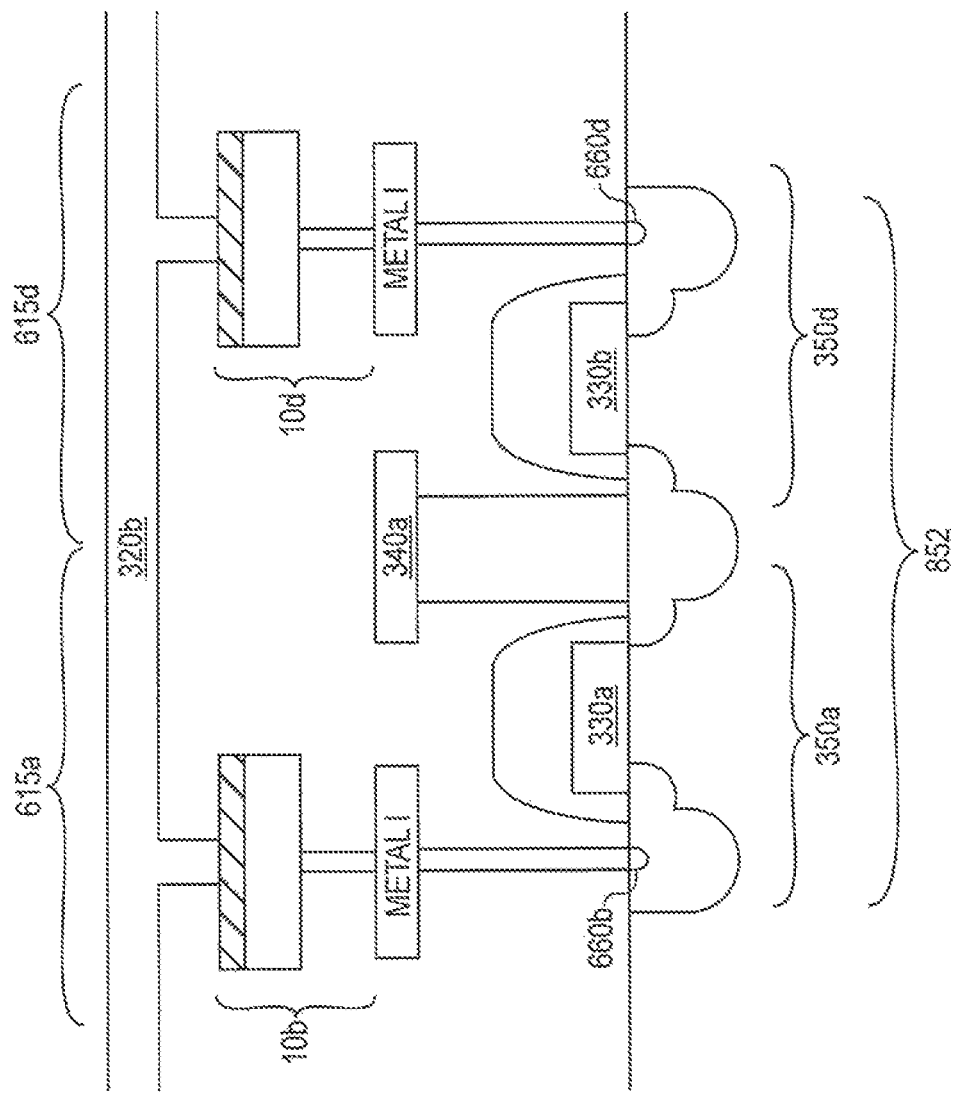

A cross-sectional view of the physical organization of two memory bit structures 615a, 615d (FIG. 4A) in device 700 is represented in FIGS. 4B and 4C. FIGS. 4B and 4C represent two different cross sectional views over a single active area 852, as illustrated in the top-down view of FIG. 4D. The cross-sectional views appear similar, however each view includes a different cell select line 320a (FIG. 4B), 320b (FIG. 4C), different memory cells 10a, 10c (FIG. 4B), 10b, 10d (FIG. 4C), and different rectifying devices 660a, 660c (FIG. 4B), 660b, 660d (FIG. 4C). A single memory bit structure 615a, 615d (FIG. 4A) includes elements of both FIGS. 4B and 4C, Memory bit structure 615a (FIG. 4A) includes word line 330a for activating access device 350a. When access device 350a is activated, bit line 340a is coupled to both memory cells 10a (FIG. 4B) and 10b (FIG. 4C) via lower metal layer 1. The top electrode of memory cell 10a is connected to cell select line 320a (FIG. 4B). The top electrode of memory cell 10b, however, is coupled to cell select line 320b (FIG. 4C). Thus, memory cells 10a and 10b share the same word line 330a, bit line 340a and access device 350a, but are coupled to different cell select lines 320a, 320b. Similarly, memory bit structure 615d (FIG. 4A) includes word line 330b for activating access device 350d. When access device 350d is activated, bit line 340a is coupled to both memory cells 10c (FIG. 4B) and 10d (FIG. 4C) via lower metal layer 1. Memory cell 10d is coupled to cell select line 320b (FIG. 4C) and memory cell 10c is coupled to cell select line 320a (FIG. 4B).

Each memory cell 10a-10d is coupled to an access device 350a, 350d via a respective rectifying device 660a-660d. The rectifying devices 660a-660d may be p-n or Schottky diodes formed in the drains of the access devices 350. Multiple rectifying devices are located within a single access device drain. For example, both memory cells 10a, 10b are coupled to rectifying devices 660a, 660b located within the drain of access device 350*a*. The rectifying devices 660*a*, 660*b* may include doped regions that are physically separate from each other, as indicated in FIG. 4I), or they may share a doped region. In either case, however, the rectifying devices 660*a*, 660*b* function as two separate devices. Similarly, rectifying devices 660*c*, 660*d* are located within the drain of access device 350*d* and may include doped regions that are physically separate from each other or that are shared.

FIG. 4D is a top-view schematic diagram of active area 852. FIG. 4D illustrates the physical relationship of the cross-sectional views of FIG. 4B and 4C to each other. Both cross-sectional views are taken above the same active area 852. Each cross-sectional view is located over two doped regions that are part of the rectifying devices 660*a*-660*d*, as explained below in connection with FIGS. 5A and 5B. The active area 852 is host to two access devices 350*a*, 350*d*. Access device 350*a* is illustrated as including the upper portion of active area 852 and is bisected by word line 330*a*. Access device 350*d* is illustrated as including the lower portion of active area 852 and is bisected by word line 330*b*. Both access devices 350*a*, 350*d* share bit line 340*a* as a source.

Figure 5A:
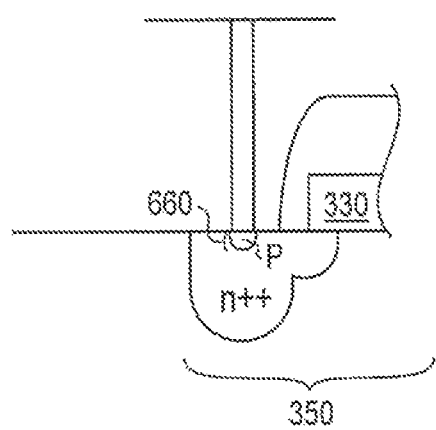
FIGS. 5A, 5B, 5C and 5D are representative diagrams and flowcharts of the formation of a rectifying device in a phase change memory bit structure according to a disclosed embodiment.
Figure 5B:
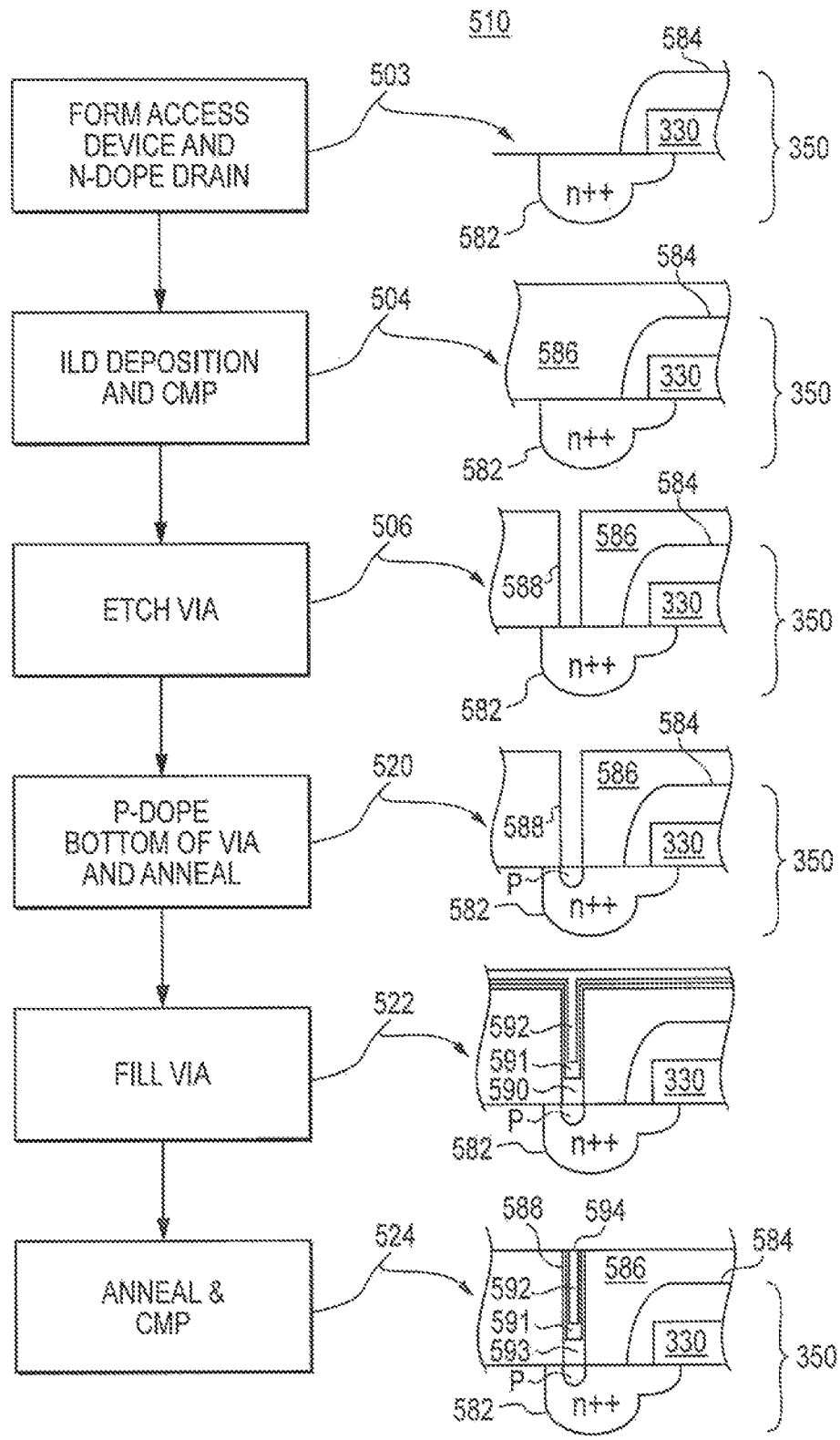

As stated above, the rectifying devices 660*a*-660*d* may be formed within the drains of the access devices 350*a*, 350*d*. For example, FIG. 5A illustrates a rectifying device 660 formed as a p-n diode in the drain of access device 350 gated by word line 330. Method 510 (FIG. 5B) is used to form the p-n diode illustrated in FIG. 5A. The components of the access device 350 are formed (step 503), such as the gate 584 and the source (not shown in FIG. 5B). The access device drain 582 is also formed and then heavily doped with, for example, arsenic or phosphorous (step 503). After the access device 350 is formed, inter-level dielectrics (ILD) 586 such as silicon dioxide are deposited in preparation for metal trace deposition and excess deposits are removed via chemical-mechanical polishing (CMP) (step 504). A via 588 is then etched through the deposited dielectrics 586, extending to the access device drain 582 (step 506). Boron implantation is used to dope the bottom of the via 588 to p-type (step 520). An annealing process is used to cause the p-type doping to diffuse sideways so as to cover the entire bottom of the via 588 (step 520). The via 588 is then tilled with a thin deposited layer of titanium 590 followed by a thin deposited layer of titanium nitride 591 and then tungsten 592 (step 522). An annealing process is again used, this time to form titanium silicide (TiSi$_2$) 593 from the initially deposited layer of titanium 590 at the bottom of the via 588, thus reducing the contact resistance (step 524). Finally, tungsten chemical-mechanical polishing is used to form the tungsten contacts 594 (step 524).

Figure 5C:
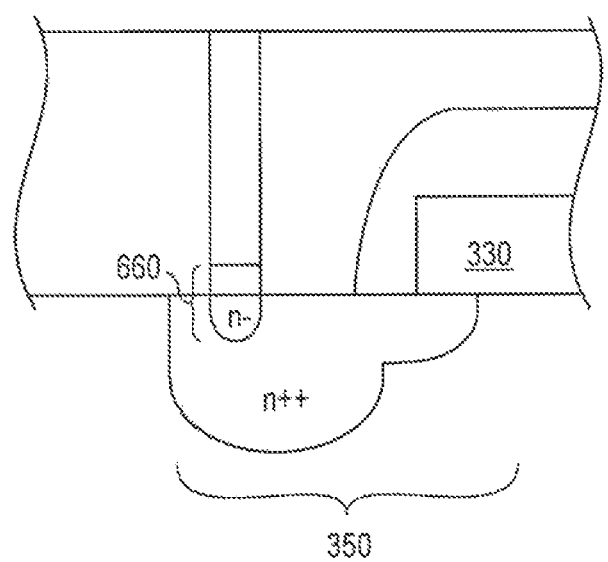
Figure 5D:
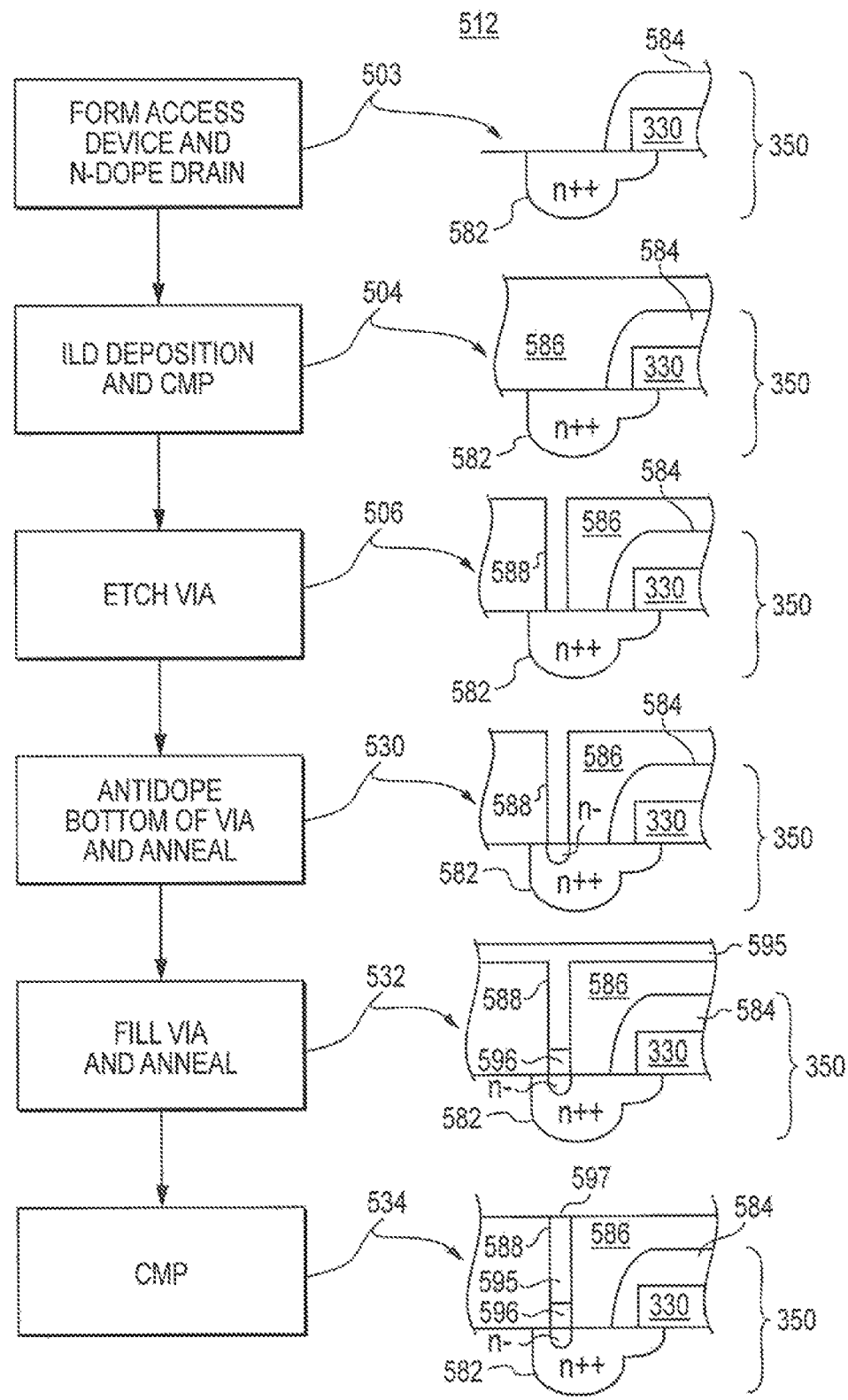

The rectifying devices 660 may also be Schottky diodes, as illustrated in FIG. 5C and method 512 of FIG. 5D. A Schottky diode formation method is similar to the p-n diode formation. In order to form a Schottky diode within the drain 582 of an access device 350, the portions of the access device 350 are formed and the access device drain 582 heavily doped with, for example, arsenic or phosphorous (step 503). After the access device 350 is formed, inter-level dielectrics (ILD) 586 such as silicon dioxide are deposited in preparation for metal trace deposition and excess deposits are removed via chemical-mechanical polishing (CMP) (step 504), A via 588 is then etched through the deposited dielectrics 586, extending to the access device drain 582 (step 506). Boron implantation is used to antidope the bottom of the via 588 to n-type (step 530). An annealing process is used to cause the n-type doping to diffuse sideways so as to cover the entire bottom of the via 588 (step 530). The via 588 is then filled with deposited platinum 595 (step 532). An annealing process is again used, this time to form platinum silicide (PtSi) 596 at the bottom of the via 588 to form the Schottky diode (step 532). Finally, a dry etch back process or chemical-mechanical polishing is used to form the platinum contacts 597 (step 508).

Figure 6A:
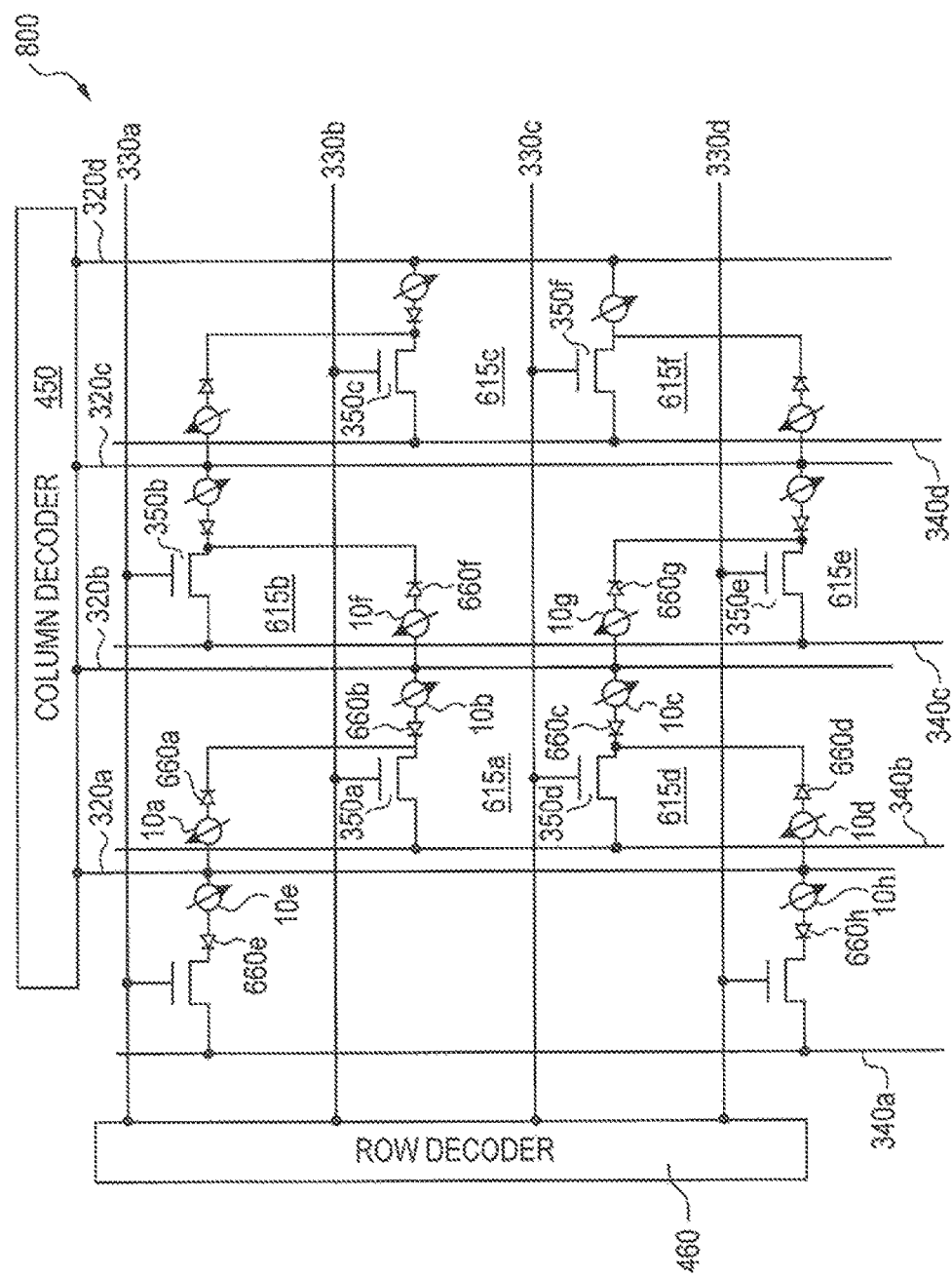
FIGS. 6A, 6B and 6C are schematic and physical representations of a phase change memory bit structure and a corresponding memory device according to a disclosed embodiment.
Figure 6B:
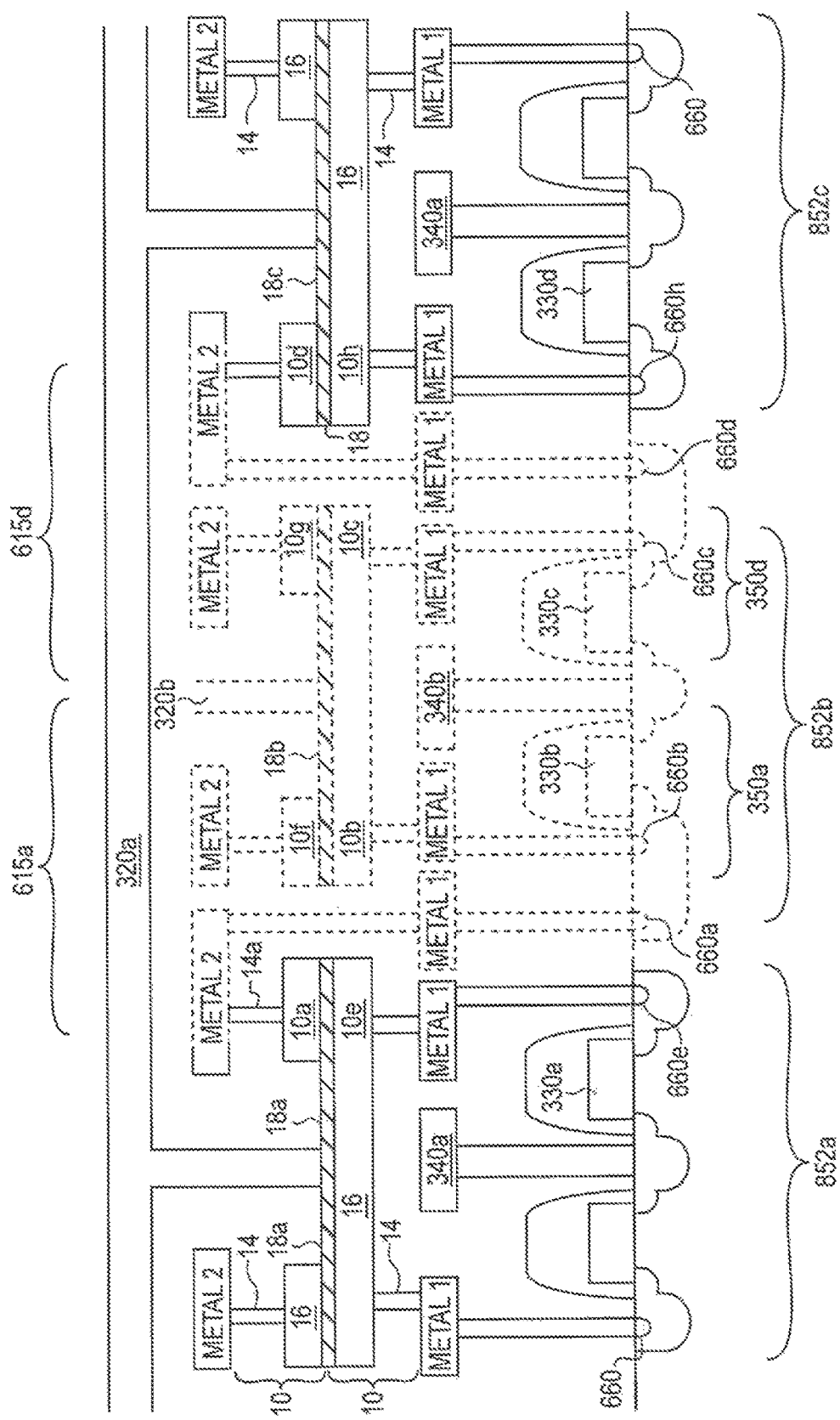

As explained above, memory device 700 is one method of implementing memory bit structure 615 (FIG. 3) into a memory array. However, more efficient designs that conserve memory bit area may be used. For example, FIG. 6A illustrates an additional method of organizing the memory bit structures 615*a*-615*f* into an array. In the memory device 800,e memory cells from different memory bit structures are arranged back-to-back with cell select lines 320*a*-320*d* intersecting the back-to-back memory cells. Physically, the back-to-back memory cells represent two stacked memory cells, with the top memory cell being arranged upside down, as is illustrated in FIG. 6B, described below. One example of back-to-back stacked memory cells are memory cells 10*a*, 10*e*. As in the memory devices described above, device 800 includes word lines 330*a*-330*d* and cell select lines 320*a*-320*d*. For each memory bit structure 615*a*-615*f*, two cell select lines and one word line are required, since each memory bit structure 615*a*-615*f* includes two memory cells. For example, in FIG. 6A, memory bit structure 615*a* is connected to both cell select lines 320*a* and 320*b* as well as the word line 330*b*. In order to select the memory cell 10*a*, cell select line 320*a* and word line 330*b* must both be activated. The current passing through the selected memory cell 10*a* is then measured by sense amplifiers (not shown), in the case of a read operation. In the case of a write operation, a stronger programming current is applied to the memory cell. A write operation for memory cell 10*a* is done by selecting memory cell 10*a* through activation of both the cell select line 320*a* and the word line 330*b*. A voltage differential between the cell select line 320*a* and the bit line 340*b* sufficient to generate a current to program the memory. cell 10*a* is created. The voltage differential may be created by altering the voltages of either the cell select line 320*a* or the bit line 340*b*, or through some combination. The bit lines 340*a*-340*d* may be tied to ground or to a fixed voltage, or may be individually addressed.

Figure 6C:
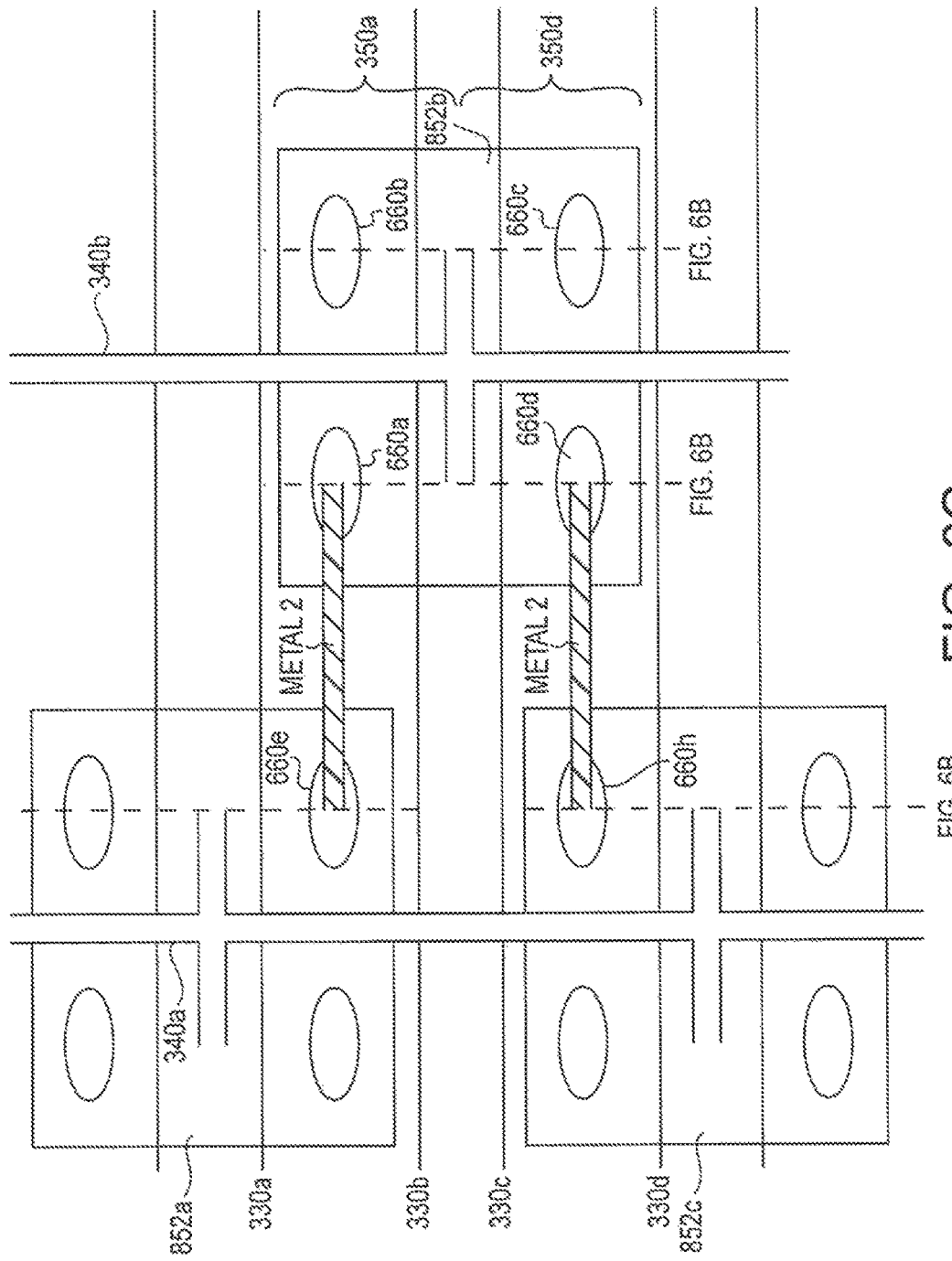

In FIG. 6B, a cross-sectional view of the physical organization of two memory bit structures 615*a*, 615*d* (FIG. 6A.) in device 800 is represented, in addition to partial depictions of other memory bit structures. The portion of FIG. 6B represented by dashed lines is not in the same cross-sectional plane as the portions of FIG. 6B represented by solid lines, as also depicted in FIG. 6C. Memory bit structure 615*a* (FIG. 6A) includes word line 330*b* for activating access device 350*a*. When access device 350*a* is activated, bit line 340*b* is coupled to both memory cells 10*a*, 10*b* via upper metal 2 and lower metal 1, respectively. Memory cell 10*a* is an upside-down memory cell stacked on top of a memory cell 10*e* from another memory bit structure. The two memory cells share the same top electrode 18*a*, which is also shared by two additional stacked memory cells. Cell select line 320*a* connects with memory cell 10*a* via the shared top electrode 18*a*. Memory cell 10*b* is the lower of two stacked memory cells 10*f*, 10*b* and is coupled to cell select line 320*b* via a top electrode 18*b*.

Similarly, memory bit structure 615*d* (FIG. 6A) includes word line 330*c* for activating access device 350*d*. When access device 350*d* is activated, bit line 340*b* is coupled to both memory cells 10*c*, 10*d* via lower metal 1 and upper metal 2, respectively. Memory cell 10*d* is an upside-down memory cell stacked on top of a memory cell 10*h* from another memory bit structure, the two memory cells 10*d*, 10*h* sharing a top electrode 18*c*. Cell select line 320*a* connects with memory cell 10*d* via the shared top electrode 18*c*. Memory cell 10*c* is the lower of two stacked memory cells 10*g*, 10*c* and is coupled to cell select line 320*b* via its top electrode 18*b*.

in the arrangement of memory bit structures 615 in FIGS. 6A and 6B, each memory cell 10*a*-10*d* shares a top electrode 18*a*-18*c* and connecting cell select line 320*a*, 320*b* with three other memory cells. As a specific example, memory cells 10*b* , 10*c*, 10*f,* 10*g* share top electrode 18*b* and are all connected to cell select line 320*b*. However, each of the four memory cells are activated by a different word line (e.g., 330*a*-330*d*). Each access device 350*a*, 350*d* operates to allow current flow through two different memory cells 10*a*-10*d* located above different active areas 852*a*-852*c*. For example, access device 350*a* controls access to memory cell 10*a* located above active area 852*a* and memory cell 10*b* located above active area 852*b*. In this way, the overall memory bit area is reduced through both a single access transistor servicing two memory cells as well as the stacking of memory cells on top of each other.

Each memory bit structure 615*a*, 615*d* also has rectifying devices 660*a*-660*d* which, in this embodiment, have been formed within the drain of the access devices 350*a*, 350*d*. As in device 700 of FIGS. 4A-4D, the rectifying devices 660*a*-660*d* may be formed using, for example, p-n diodes or Schottky diodes, as explained in relation to FIGS. 5A and 5B.

FIG. 6C represents a top-down view of a portion of memory device 800. In FIG. 6C, each active area 852*a*-852*c* includes two access devices. For example, access devices 350*a* and 350*d* are in the active area 852*b*. Within active area 852*b*, access device 350*a* is gated by word line 330*b* and, when activated, couples bit line 340*b* to memory cells 10*a* (FIG. 6B), located above active area 852*a* and memory cell 10*b* (FIG. 6B), located above active area 852*b*. Similarly, access device 350*d* is gated by word line 330*c* and, when activated, couples bit line 340*b* to memory cells 10*c*, 10*d*, located above active areas 852*b*, 852*c*, respectively. In each case, the controlling access device 350*a*, 350*d* controls access to memory cells that are located above two adjacent but staggered active areas(e.g., 852*a*, 852*c*). Memory cells that are located above active areas that are adjacent to the active area wherein the controlling access device is located are coupled to their controlling access devices via a metal 2 trace and a rectifying device 660*a*-660*d*. The rectifying device 660*a*-660*d* is formed within the drain of the controlling access device 350*a*, 350*d* and is represented in FIG. 6C as a doped region 660*a*-660*d*.

Figure 7A:
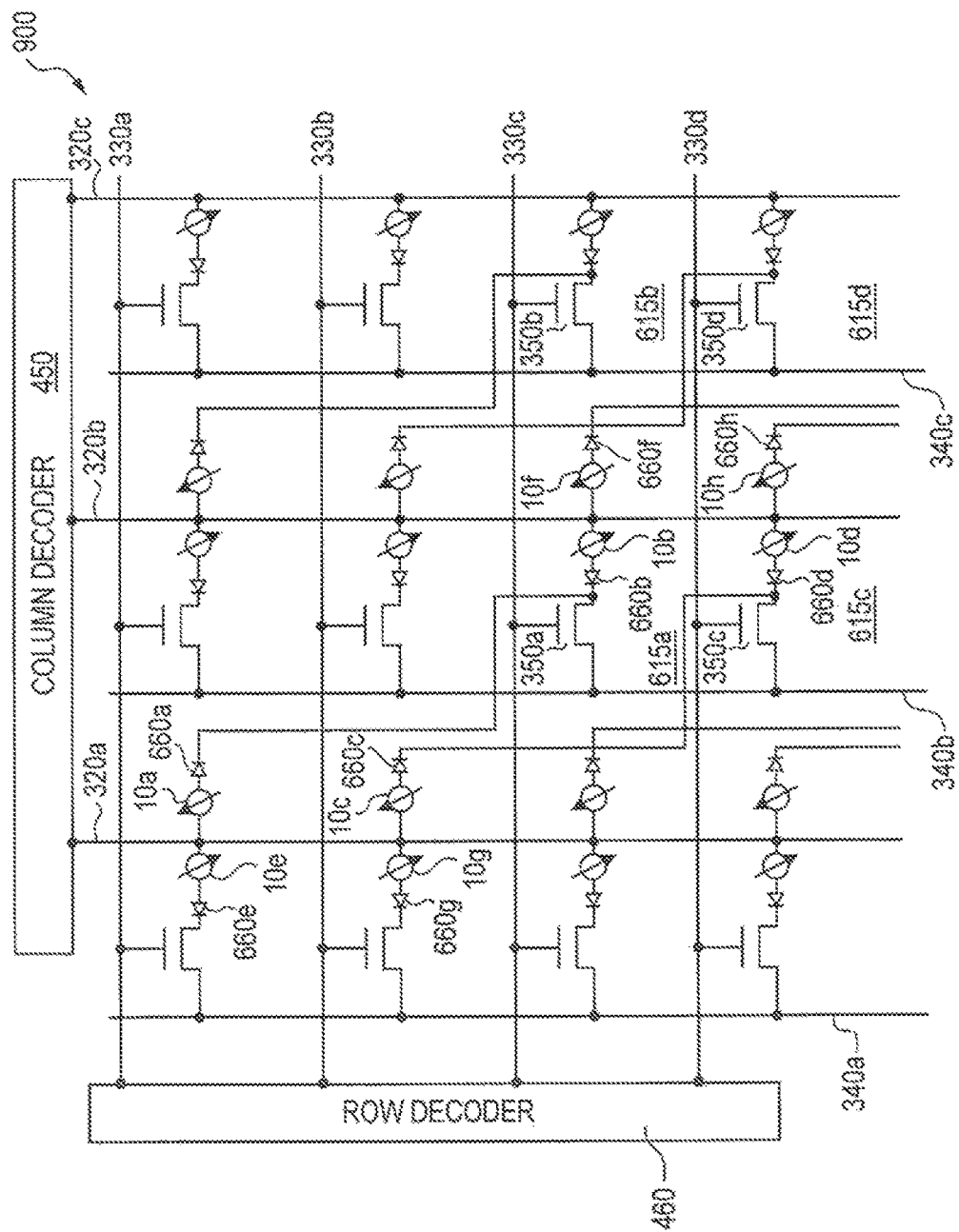

An additional method of organizing the memory bit structures 615 into an array is illustrated in FIG. 7A. In FIG. 7A, memory device 900 includes memory cells from different memory bit structures 615*a*-615*d* that are arranged back-to-back with cell select lines 320*a*-320*c* intersecting the back-to-back memory cells. The primary difference between the organization of memory device 800 and memory device 900 is that the memory bit structures 615*a*-615*d* in device 900 are arranged in a parallel manner and are not staggered as in device 800. The parallel structure results in a tighter access device 350*a*-350*d* layout. In order to achieve the parallel layout, the two memory cells in each memory bit structure are arranged above diagonally proximate active areas 852*a*-852*d*, as illustrated in FIG. 7C.

Figure 7B:
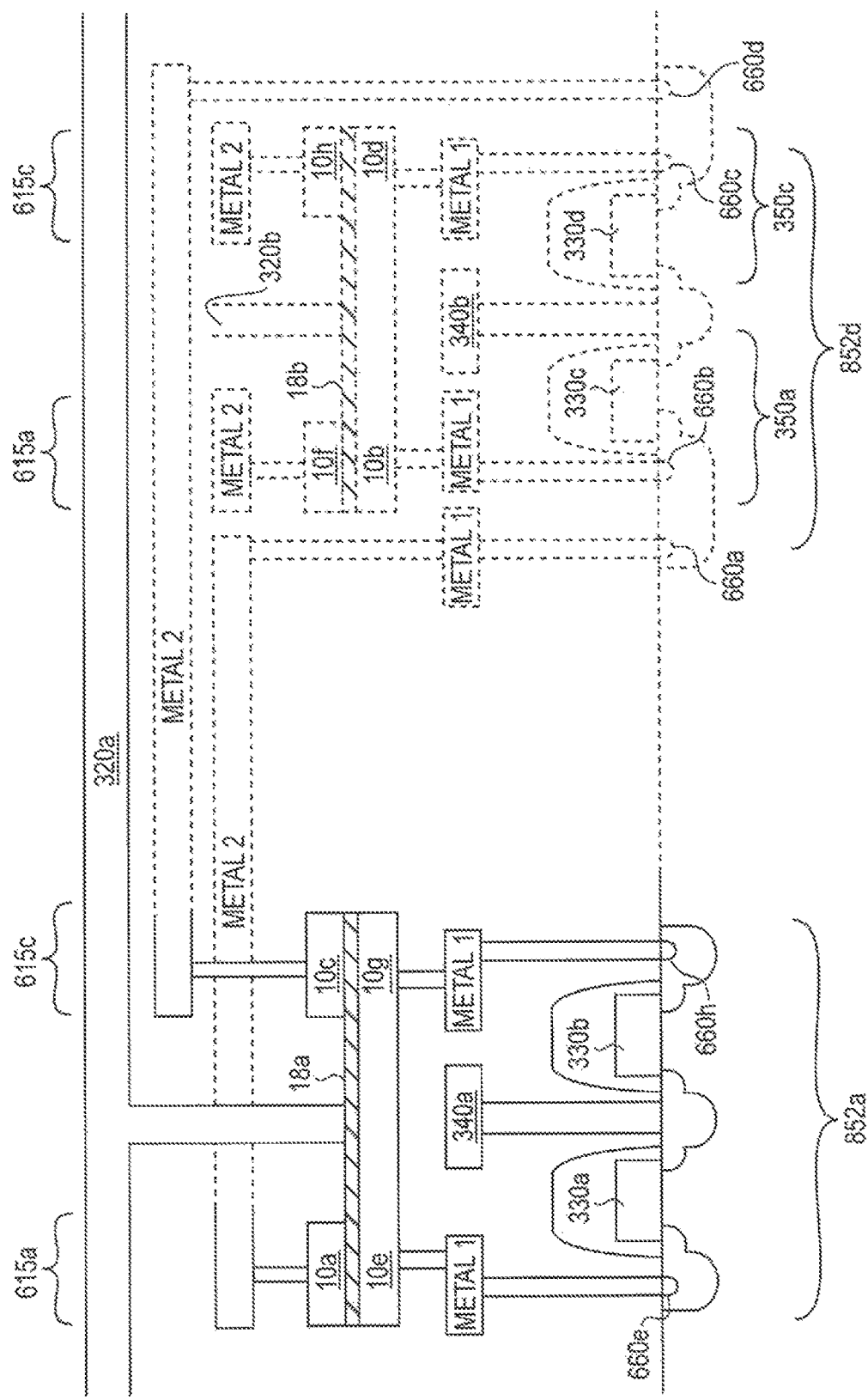

FIG. 7B represents a cross-sectional view of the physical organization of two memory bit structures 615*a*, 615*c* in device 900. The portion of FIG. 7B represented by dashed lines is not in the same cross-sectional plane as the portions of FIG. 7B represented by solid lines. Memory hit structure 615*a* (FIG. 7A) includes word line 330*c* for activating access device 350*a*. When access device 350*a* is activated, bit line 340*b* is coupled to both memory cells 10*a*, 10*b* via upper metal 2 and lower metal 1, respectively. Memory cell 10*a* is an upside-down memory cell stacked on top of a memory cell 10*e* from another memory bit structure. The two memory cells 10*a* , 10*e* share the same top electrode 18*a*, which is also shared by two additional stacked memory cells 10*c*, 10*g*. Cell select line 320*a* connects with memory cell 10*a* via the shared top electrode 18*a* . Memory cell 10*b* is the lower of two stacked memory cells 10*f,* 10*b* and is coupled to cell select line 320*b* via a top electrode 18*b*. Similarly, memory bit structure 615*c* (FIG. 7A) includes word line 330*d* for activating access device 350*c*. When access device 350*c* is activated, bit line 340*b* is coupled to both memory cells 10*c*, 10*d* via lower metal 1 and upper metal 2, respectively. Memory cell 10*c* is an upside-down memory cell stacked on top of a memory cell 10*g* from another memory bit structure, the two memory cells 10*c*, 10*g* sharing a top electrode 18*a*. Cell select line 320*a* connects with memory cell 10*d* via the shared top electrode 18*a*. Memory cell 10*d* is the lower of two stacked memory cells 10*h*, 10*d* and is coupled to cell select line 320*b* via its top electrode 18*b* Bit lines 340*a*-340*c* are individually addressed.

The arrangement of the memory bit structures 615*a*-615*d* in device 900 differs from the physical arrangement of the memory bit structures in device 800 in that the two memory bit structures 615*a*, 615*c* depicted in FIG. 7B are located above only two active areas, 852*a*, 852*d*. In device 800, three active areas are used to implement any pair of memory bit structures. The reduced number of active areas used by the memory bit structures 615*a*-615*d* in device 900 allows the active areas 852*a*-852*d* to be arranged in a parallel orientation (as opposed to a staggered orientation as depicted in FIG. 6C).

In the top-down view of FIG. 7C, each active area 852*a*-852*d* includes two access devices. The access devices 350*a* and 350*c* that control access to the memory hit structures 615*a* and 615*c* are both located in active area 852*d*. Within active area 852*d*, access device 350*a* is gated by word line 330*c* and, when activated, couples bit line 340*b* to memory cell 10*a* (FIG. 7B) located above active area 852*a* and memory cell 10*b* (FIG. 7B) located above active area 852*d*. Similarly, access device 350*c* is gated by word line 330*d* and, when activated, couples bit line 340*b* to memory cells 10*c*, 10*d*, also located above active areas 852*d* and 852*a*, respectively. In both cases, access devices 350*a*, 350*c* control access to memory cells that are located in two different active areas 852*a*, 852*d*.

Figure 13A:
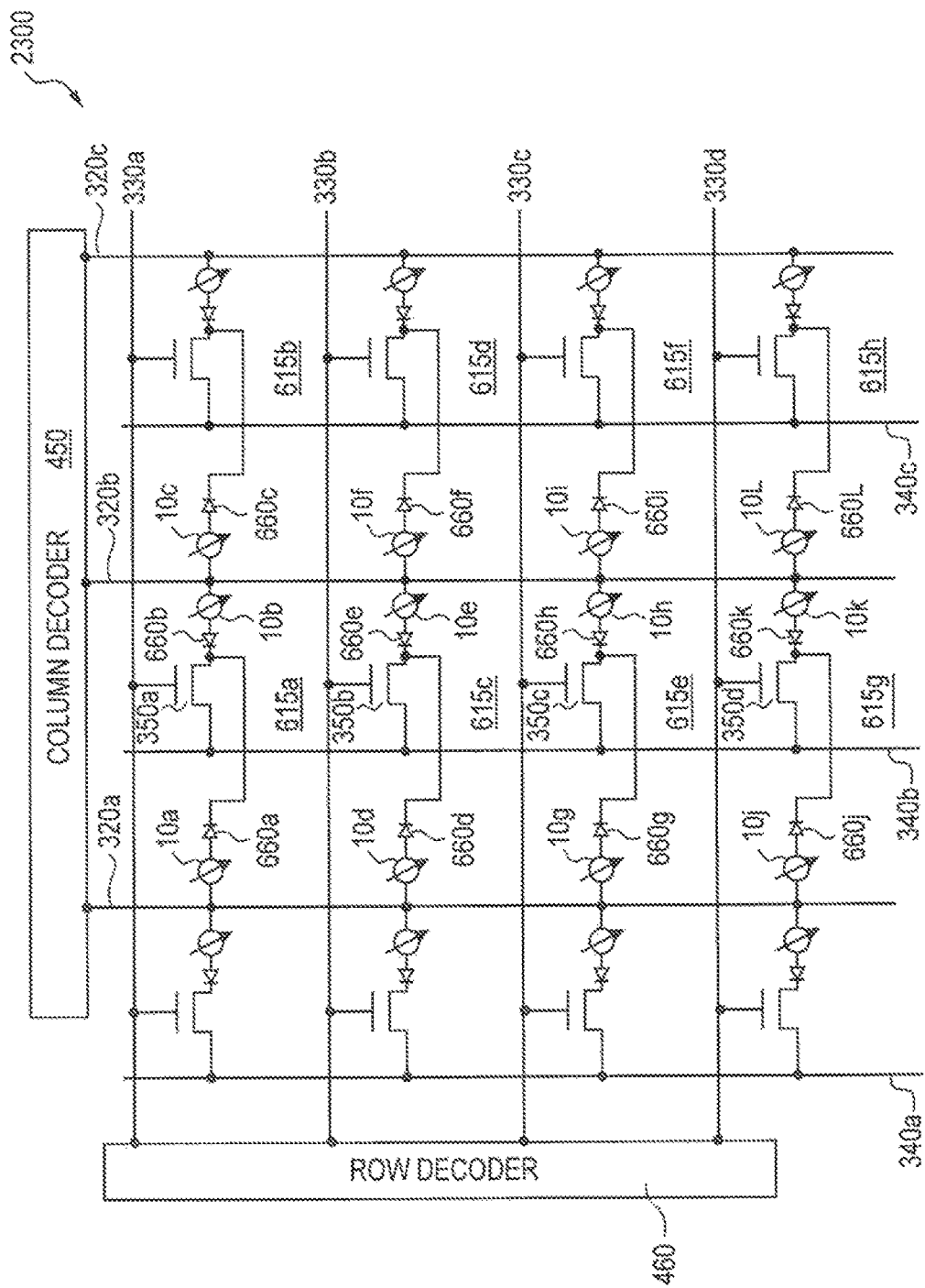
Figure 13B:
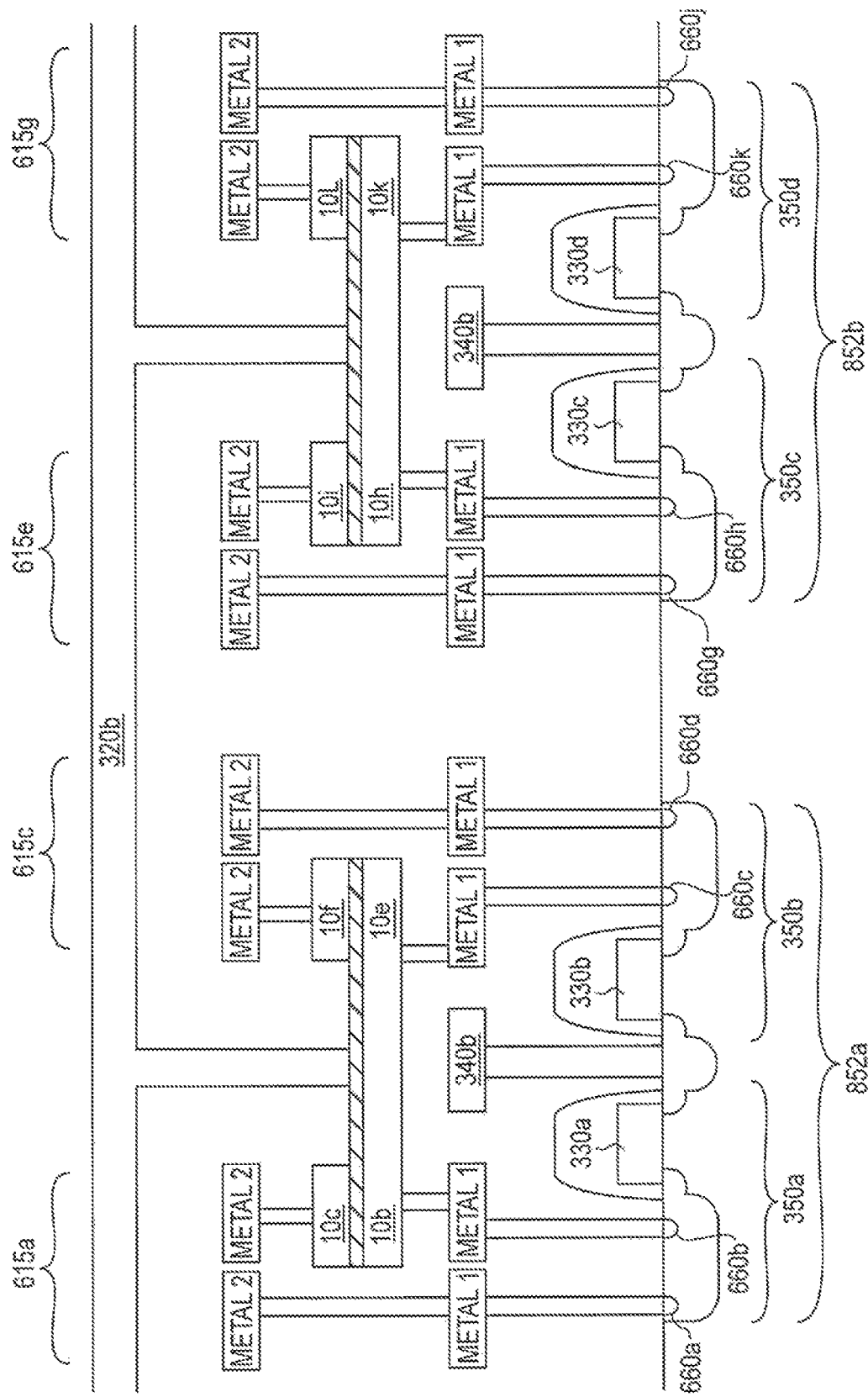

FIGS. 13A-13C represent a similar circuit (memory device 2300 in FIG. 13A), organization and arrangement as shown in FIGS. 7A-7C. However, in FIGS. 13A-13C, more than one memory cell shares the same cell select line and word line. For example, in FIG. 13A, memory bit structures 615*a* and 615*b* include memory cells 101), 10*c*, respectively. Both memory cells 10*b* , 10*c* are activated by utilizing cell select line 320*b* and word line 330*a*. As a result, memory cell selection requires that the bit lines 340*b*, 340*c* be individually addressed. For example, memory cell 10*b* is selected by activating the word line 330*a* and the cell select line 320*b*, and by appropriately biasing the bit line 340*b*. Similarly, memory cell 10c is selected by activating word line 330a and cell select line 320b, and by appropriately biasing the bit line 340c.

Figure 8A:
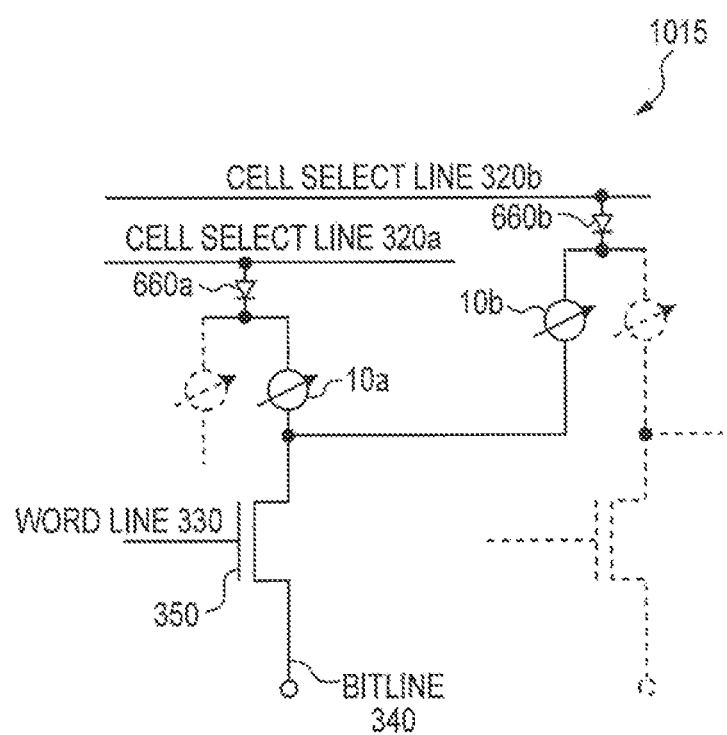
FIGS. 8A, 8B, 8C and 8D are schematic and physical representations of a phase change memory bit structure and a corresponding memory device according to a disclosed embodiment.

Another improved memory bit structure that results in reduced memory bit area is illustrated in FIG. 8A. FIG. 8A represents a memory bit structure 1015 that is similar to the memory bit structure 615 of FIG. 3 except that the rectifying devices 660a, 660b have been moved so as to be positioned in between the memory cells 10a, 10b and the cell select lines 320a, 320b. The rectifying devices 660a, 660b are preferably silicon p-n diodes or Schottky diodes but are, in this embodiment, not formed within the drains of an access device 350. In the memory bit structure 1015, one rectifying device can service two memory cells, each of which is from a different memory bit structure 1015. Thus, the reduction in components results in an overall reduction in memory bit area.

Figure 8B:
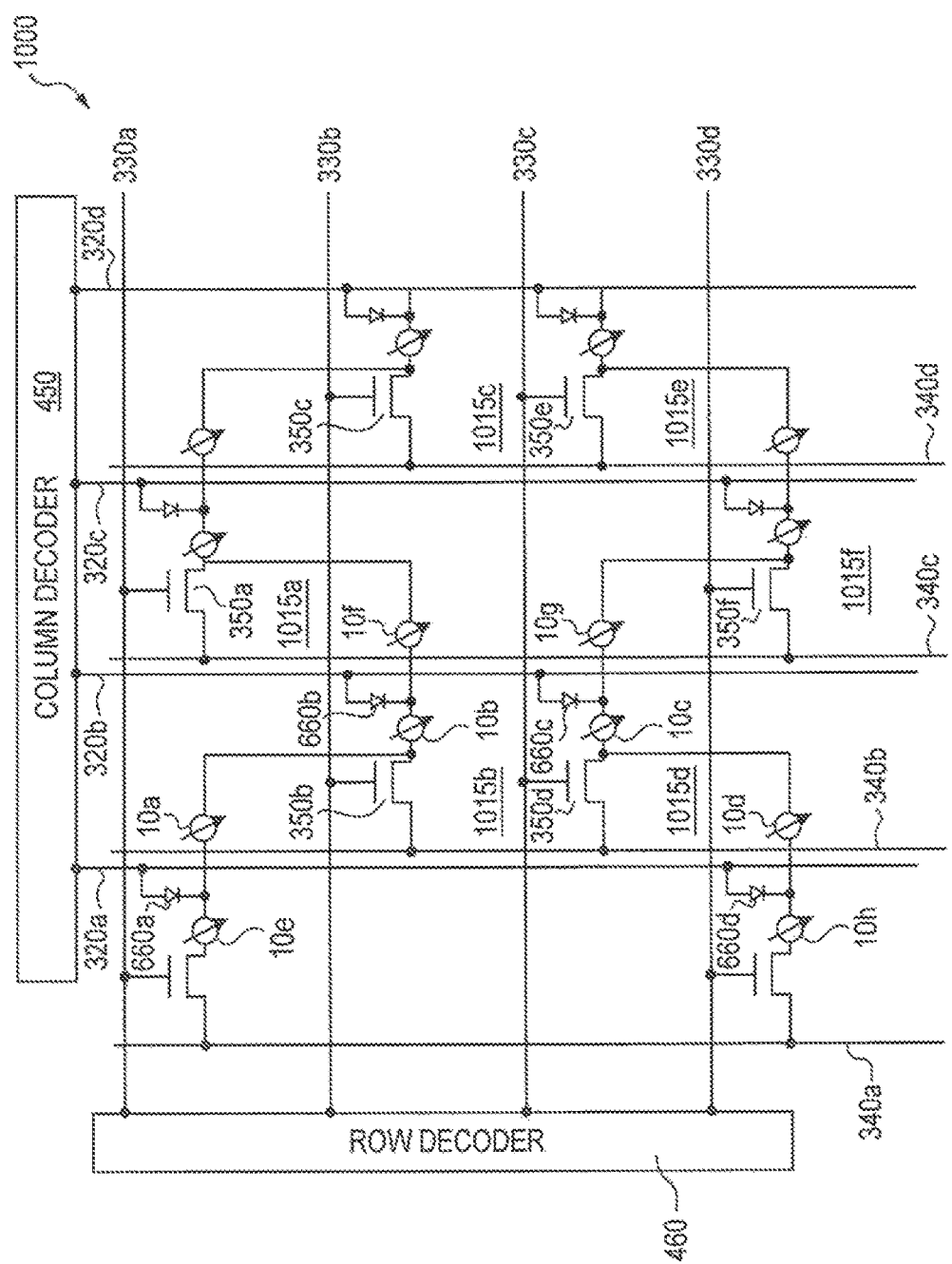

FIG. 8B illustrates a memory device 1000 that includes a staggered arrangement of the memory bit structures 1015a-1015f. As in the memory devices 800, 900, the memory cells in memory device 1000 are stacked. This time, however, the cell select lines 320a-320d connect first to a rectifying device (e.g., 660a-660d) and then to the top electrodes of the stacked memory cells 10a-10h.

Figure 8C:
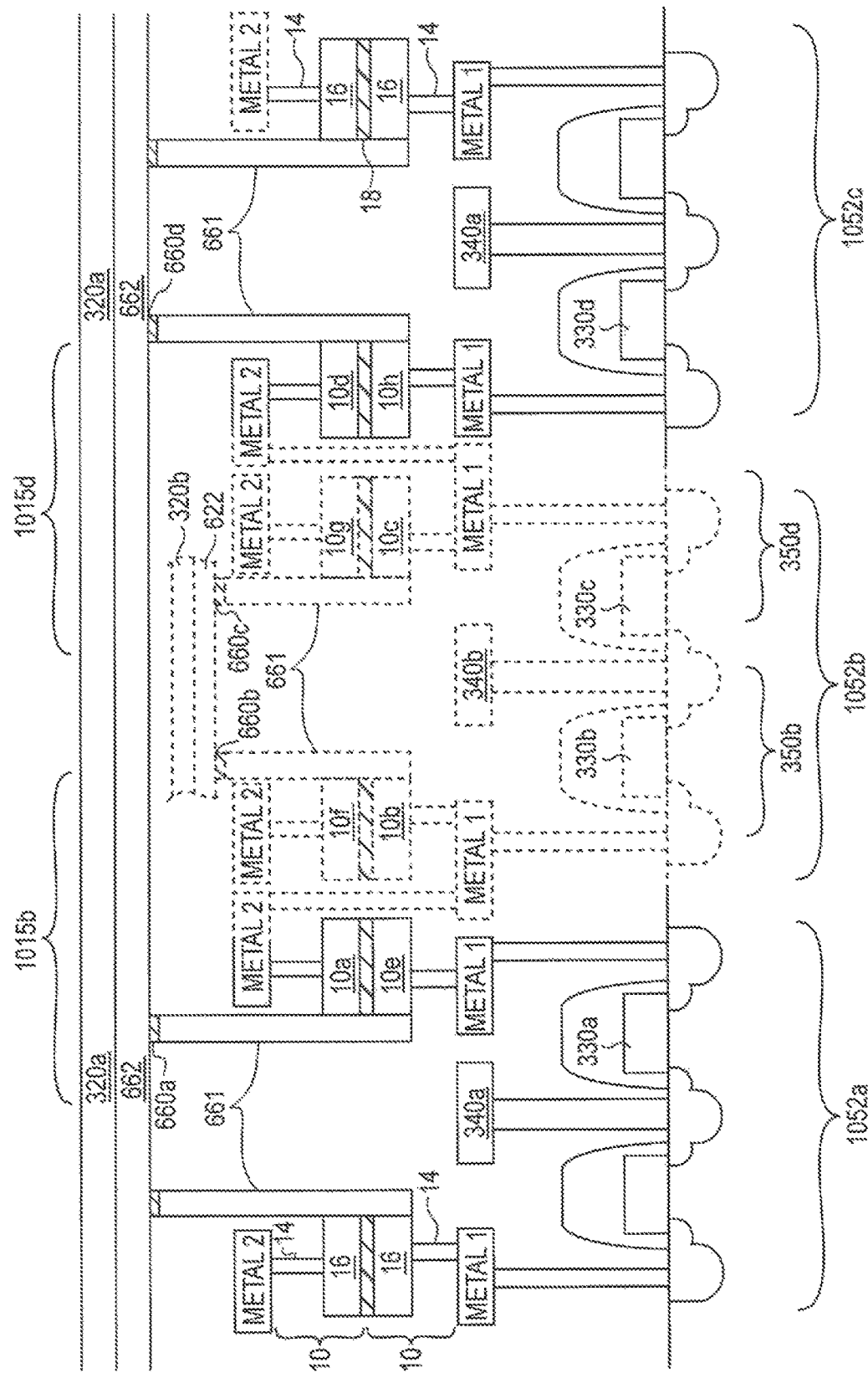

FIG. 8C illustrates a cross-sectional view of the physical organization of two memory bit structures 1015b, 1015d in device 1000, in addition to partial depictions of other memory bit structures. The dashed lines in FIG. 8C represent structures that are not in the same viewing plane as those depicted using solid lines. However, by referencing the top-down view of FIG. 8D, it is apparent that some "solid" structures are in different planes than other depicted "solid" structures. A similar statement may be made regarding the "dashed line" structures. In other words, the structures depicted in FIG. 8C are located within multiple viewing planes; hence FIG. 8C should be viewed in conjunction with FIG. 8D.

One of the significant differences between the cross-sectional view of memory device 1000 shown in FIG. 8C and the cross-sectional view of memory device 800 in FIG. 6B is the absence of the rectifying devices 660a-660d in the access device drains and the presence of rectifying devices 660a-660d connected to the cell select lines 320a, 320b. The rectifying devices 660a-660d are formed by the junction of material layers 661, 662. Material layer 661 is formed within the vias connecting the cell select lines 320a, 320b to the memory cells 10a-10h. Material layer 662 is formed as a layer directly underneath the cell select lines 320a, 320b. The junction between material layers 661 and 662 is a junction between two oppositely doped regions. Material layers 661, 662 may be formed of various materials such as doped polysilicon and titanium or platinum, as long as the junction of the two layers forms a rectifying device 660a-660d such as a p-n diode or a Schottky diode.

Similar to that explained above in conjunction with FIG. 6B, memory bit structure 1015b (FIG. 8B) includes word line 330b for activating access device 350b. When access device 350b is activated, bit line 340b is coupled to both memory cells 10a, 10b. Memory cell 10a is an upside-down memory cell stacked on top of a memory cell 10e from another memory bit structure. Cell select line 320a connects with memory cell 10a via rectifying device 660a. Memory cell 10b is the lower of two stacked memory cells 10f, 10b and is coupled to cell select line 320b via rectifying device 660b. Similarly, memory bit structure 1015d (FIG. 8B) includes word line 330c for activating access device 350d. When access device 350d is activated, bit line 340b is coupled to both memory cells 10c, 110d. Memory cell 10d is an upside-down memory cell stacked on top of a memory cell 10h from another memory bit structure. Cell select line 320a connects with memory cell 10d via rectifying device 660d. Memory cell 10c is the lower of two stacked memory cells 10g, 10c and is coupled to cell select line 320b via rectifying device 660c.

Figure 8D:
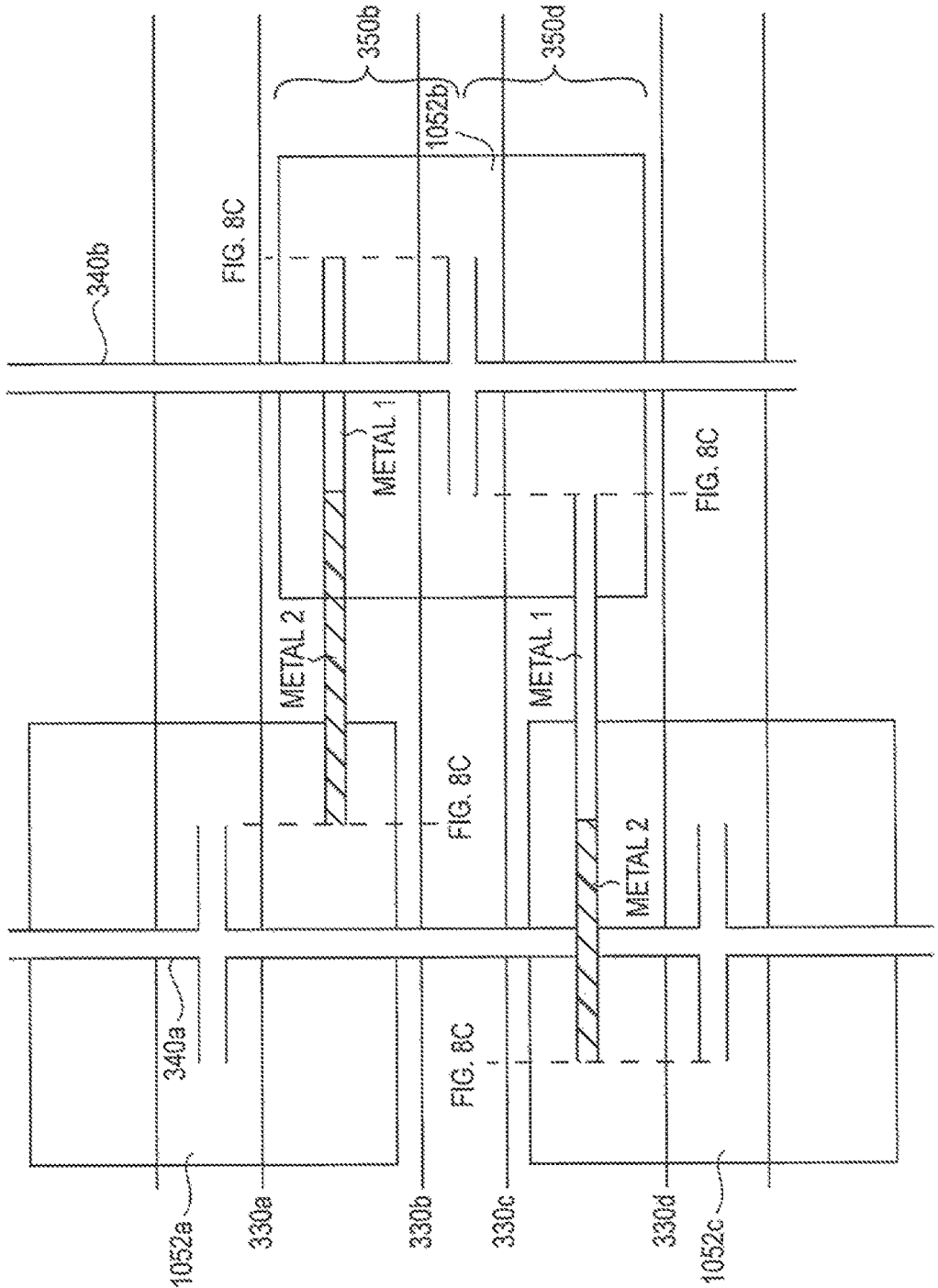

FIG. 8D represents a top-down view of the memory bit structures 1015b and 1015d depicted in FIG. 8C. As in devices 700, 800 and 900, each active area 1052a-1052c includes two access devices. However, active areas 1052a-1052c are different from the active areas used in devices 700, 800 and 900 in that active areas 1052a-1052c do not include one or more rectifying devices. In FIG. 8D, access devices 350b and 350d are in the active area 1052b. Within active area 1052b, access device 350b is gated by word line 330b and, when activated, couples bit line 340b to memory cell 10a (FIG. 8C) located above active area 1052a and memory cell 10b (FIG. 8C) located above active area 1052b. Similarly, access device 350d is gated by word line 330c and, when activated, couples bit line 340b to memory cell 10c (FIG. 8C) located above active area 1052b and memory cell 10d (FIG. 8C) located above active area 1052c. Note that access devices 350b, 350d control access to memory cells that are located in two adjacent but staggered active areas 1052a, 1052c.

Similar to memory devices 900 and 2300, the bit lines 340a-340d in device 1000 must be appropriately biased in order to select a memory cell. In other words, selection of a memory cell requires selecting the corresponding word line, cell select line and bit line. Also, the rectifying devices 660b and 660c may also be merged into one rectifying device connecting a common top electrode similar to memory device 900.

Figure 9A:
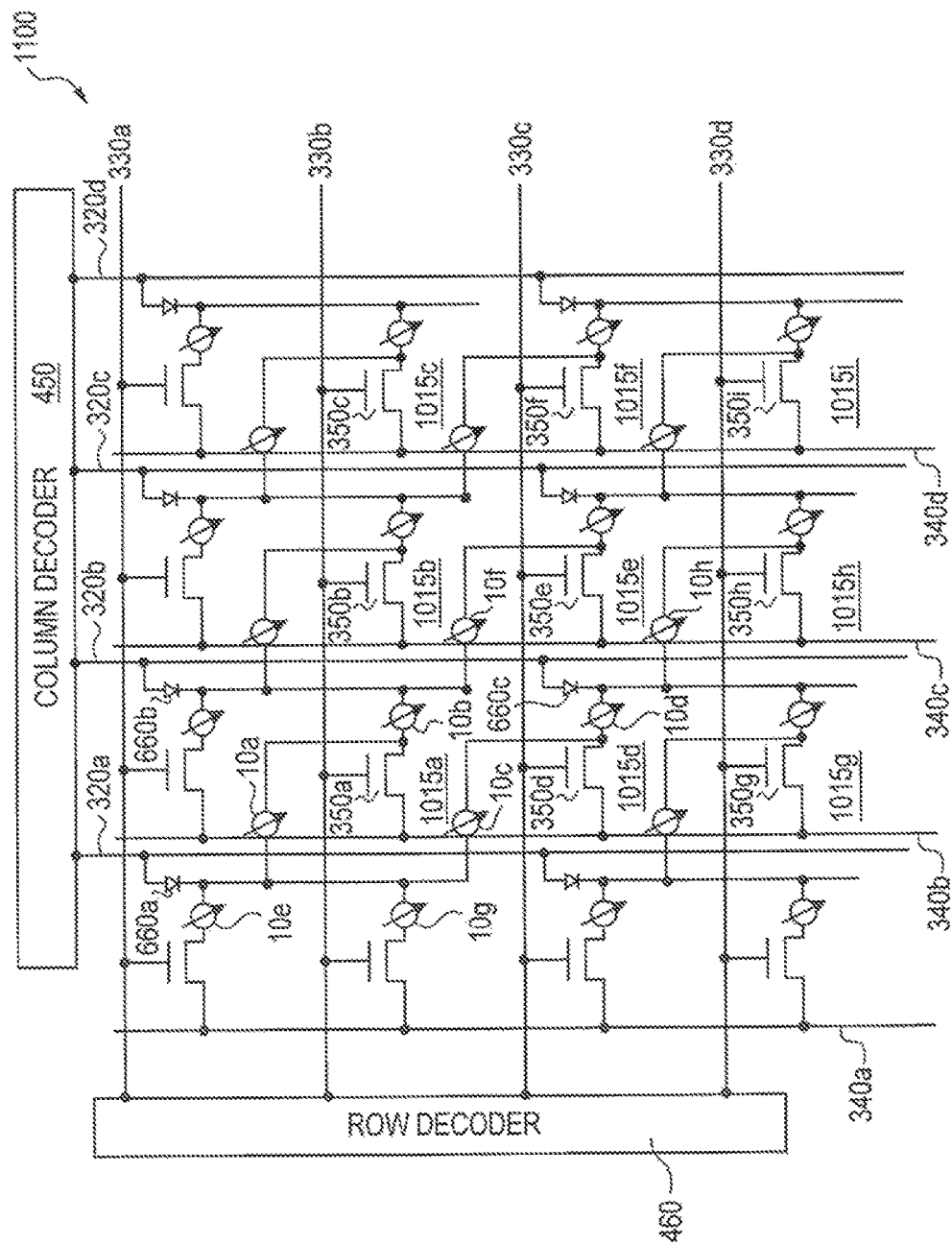
Figure 9B:
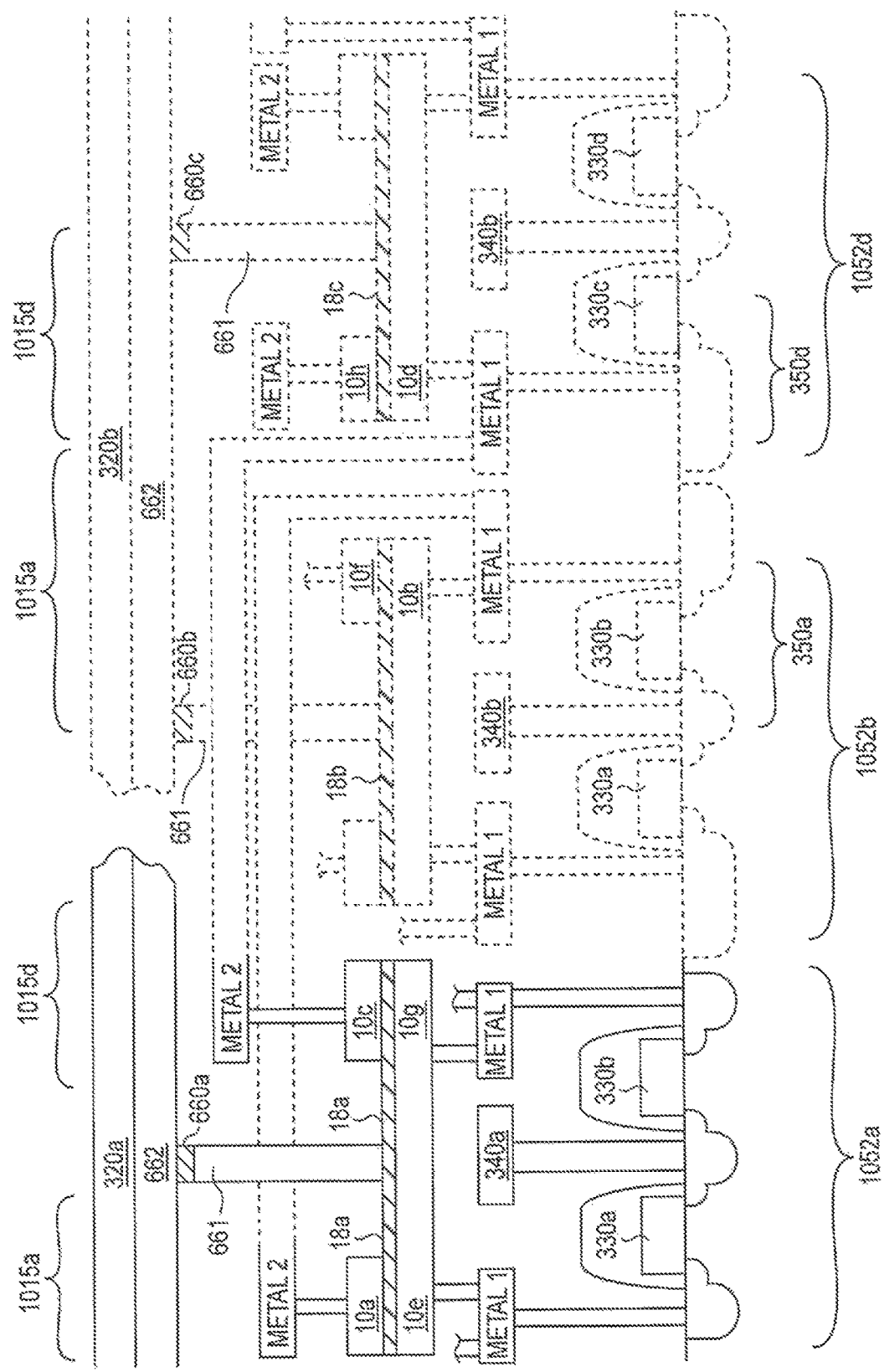

A modification to device 1000 is depicted in FIG. 9A. In FIG. 9A, memory device 1100 includes a parallel arrangement of memory bit structures 1015a-1015i. Each memory bit structure 1015a-1015i includes a single access device 350a-350i and two memory cells (e.g., 10a-10d). The memory cells are stacked with memory cells from adjacent memory bit structures, as depicted in FIG. 9B. For example memory cells 10a, 10e are stacked; memory cells 10c, log are also stacked. A rectifying device (e.g., 660a-660c) is connected between each memory cell and the cell's corresponding cell select line 320a-320d. Significantly, in device 1100, only one rectifying device is used for up to four memory cells. Each of the four memory cells connected to the same rectifying device is from a different memory bit structure. The rectifying devices 660a-660c, as described in relation to FIG. 8C, are formed from the junctions of material layers 661 and 662, wherein the junction represents a boundary between two oppositely doped regions. For example, the top portion of material layer 661 could be n-doped, and the portion of material layer 662 near the junction could p-doped, thus forming a p-n diode. As described above, a Schottky diode may also be formed.

FIG. 9B illustrates a cross-sectional view of the physical organization of two memory bit structures 1015a, 1015d in device 1100, in addition to partial depictions of other memory bit structures. The dashed lines in FIG. 9B represent structures that are not in the same viewing plane as those depicted using solid lines. Also, the structure indicated over active area 1052b in FIG. 9B has been shifted for viewing purposes, but is in reality located behind the structure located over active area 1052a (refer to FIG. 9C for further clarity).

In FIG. 9B, cell select lines 320a, 320b are connected to the memory cell top electrodes 18a-18c via rectifying devices 660a-660c. Each rectifying device 660a-660c couples a cell select line 320a, 320b to four memory cells. For example, the structure above active area 1052a depicts cell select line 320a coupled to memory cells 10a, 10e, 10c, 10g via rectifying device 660a. In this way, the number of physical components or structures per each memory bit structure is reduced, and the overall structure of device 1100 is simplified. The reduction in structures also allows the memory bit structures 1015a-1015i (FIG. 9A) to be fabricated more compactly.

In FIG. 9B, memory bit structures 1015a and 1015d are depicted. In memory bit structure 1015a, word line 330b may be used to activate access device 350a. When access device 350a is activated, bit line 340b is coupled to both memory cells 10a, 10b. Memory cell 10a is an upside-down memory cell stacked on top of a memory cell 10e from another memory bit structure. Cell select line 320a connects with memory cell 10a via rectifying device 660a. Memory cell 10b is the lower of two stacked memory cells 10f, 10b and is coupled to cell select line 320b via rectifying device 660b. Similarly, memory bit structure 1015d (FIG. 9A) includes word line 330c for activating access device 350d. When access device 350d is activated, bit line 340b is coupled to both memory cells 10c, 10d. Memory cell 10c is an upside-down memory cell stacked on top of a memory cell 10g from another memory bit structure. Cell select line 320a connects with memory cell 10c via rectifying device 660a. Memory cell 10d is the lower of two stacked memory cells 10h, 10d and is coupled to cell select line 320b via rectifying device 660c.

FIG. 9C represents a top-down view of the memory bit structures 1015a, 1015d depicted in FIG. 9B. Each active area 1052a-1052d includes two access devices. In FIG. 9C, access device 350a is in the active area 1052b. Access device 350d is in the active area 1052d, Within active area 1052b, access device 350a is gated by word line 330b and, when activated, couples bit line 340b to memory cell 10a (FIG. 9B) located above active area 1052a and memory cell 10b (FIG. 9B) located above active area 1052b. Similarly, access device 350d is gated by word line 330c and, when activated, couples bit line 340b to memory cell 10c (FIG. 9B) located above active area 1052a and memory cell 10d (FIG. 9B) located above active area 1052d. The parallel configuration of the active areas 1052a-1052d results in device 1100 being more dense and area efficient than devices where the active areas are staggered.

Figure 14A:
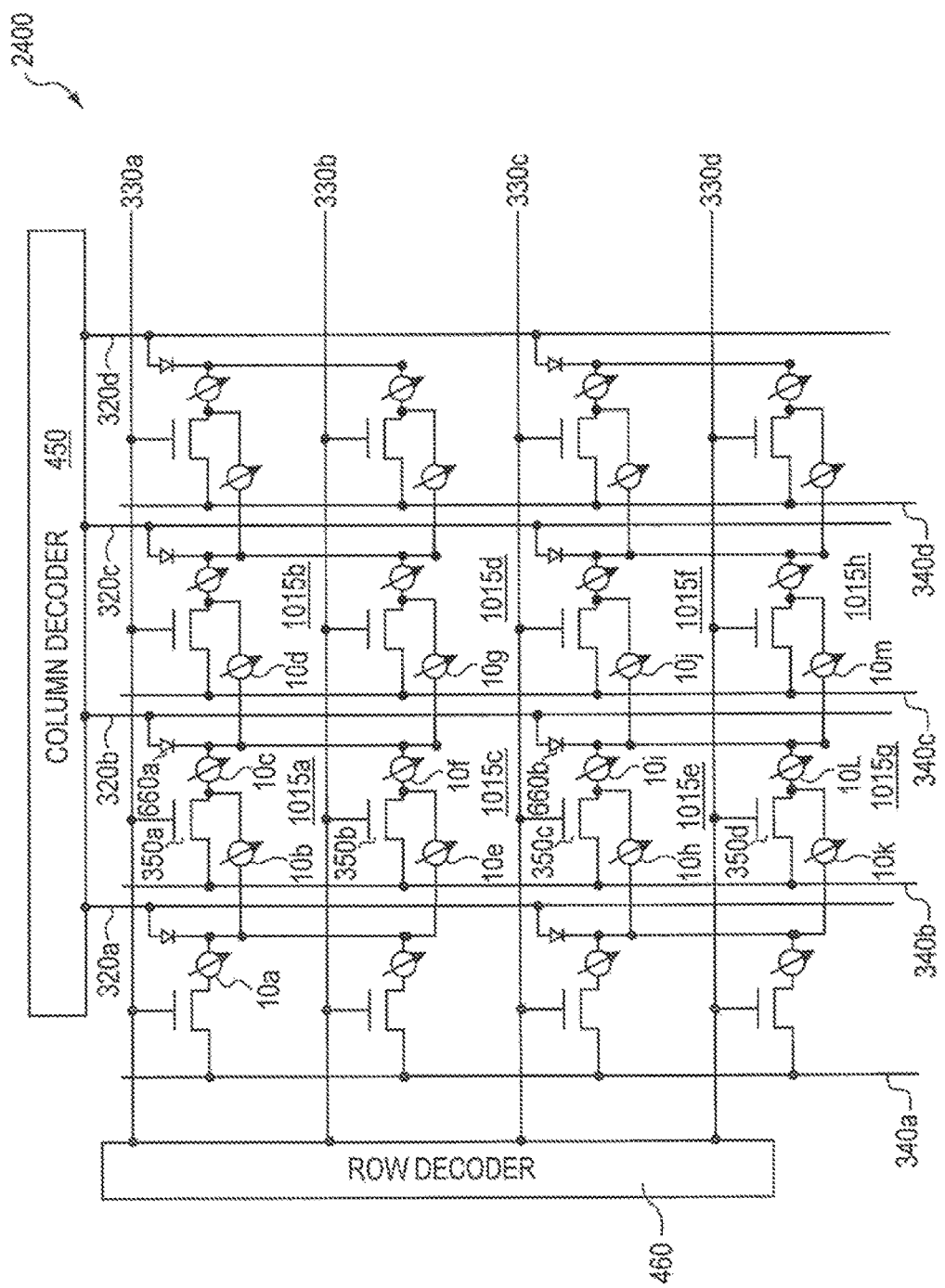
FIGS. 14A, 14B and 14C are schematic and physical representations of a phase change memory bit structure and a corresponding memory device according to a disclosed embodiment.
Figure 14B:
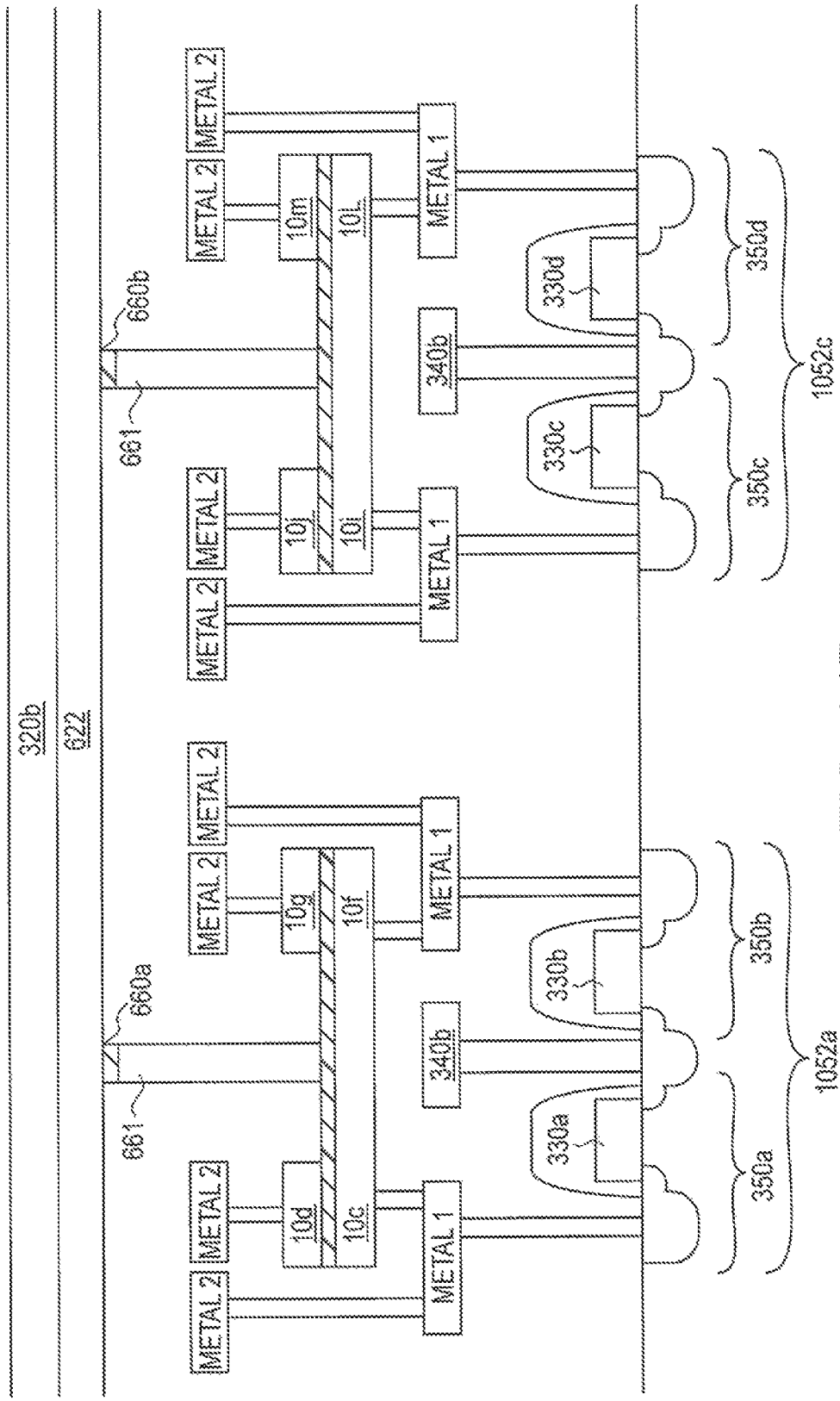
Figure 14C:
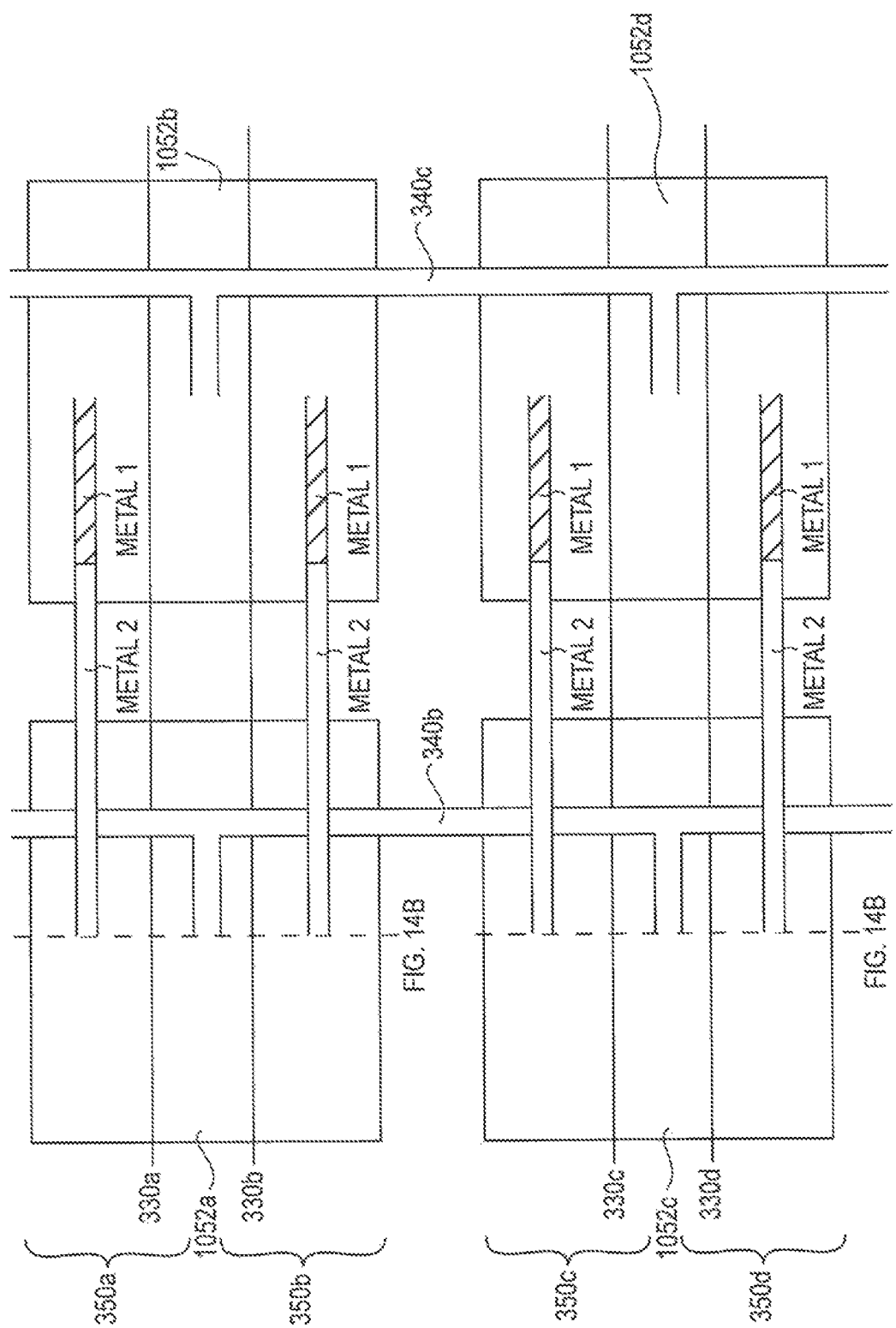

FIGS. 14A-14C represent a similar circuit (memory device 2400 in FIG. 14A), organization and arrangement as shown in FIGS. 9A-9C. However, in FIGS. 14A-14C, more than one memory cell shares the same cell select line and word line. For example, in FIG. 14A, memory bit structures 1015a and 1015b include memory cells 110c, 10d, respectively (among—others). Both memory cells 10c, 10d are activated by utilizing cell select line 320b and word line 330a. As a result, memory cell selection requires that the bit lines 340b, 340c be individually addressed. For example, memory cell 10c is selected by activating the word line 330a and the cell select line 320b, and by appropriately biasing the bit line 340b. Similarly, memory cell 10d is selected by activating word line 330a and cell select line 320b, and by appropriately biasing the bit line 340c.

Figure 10A:
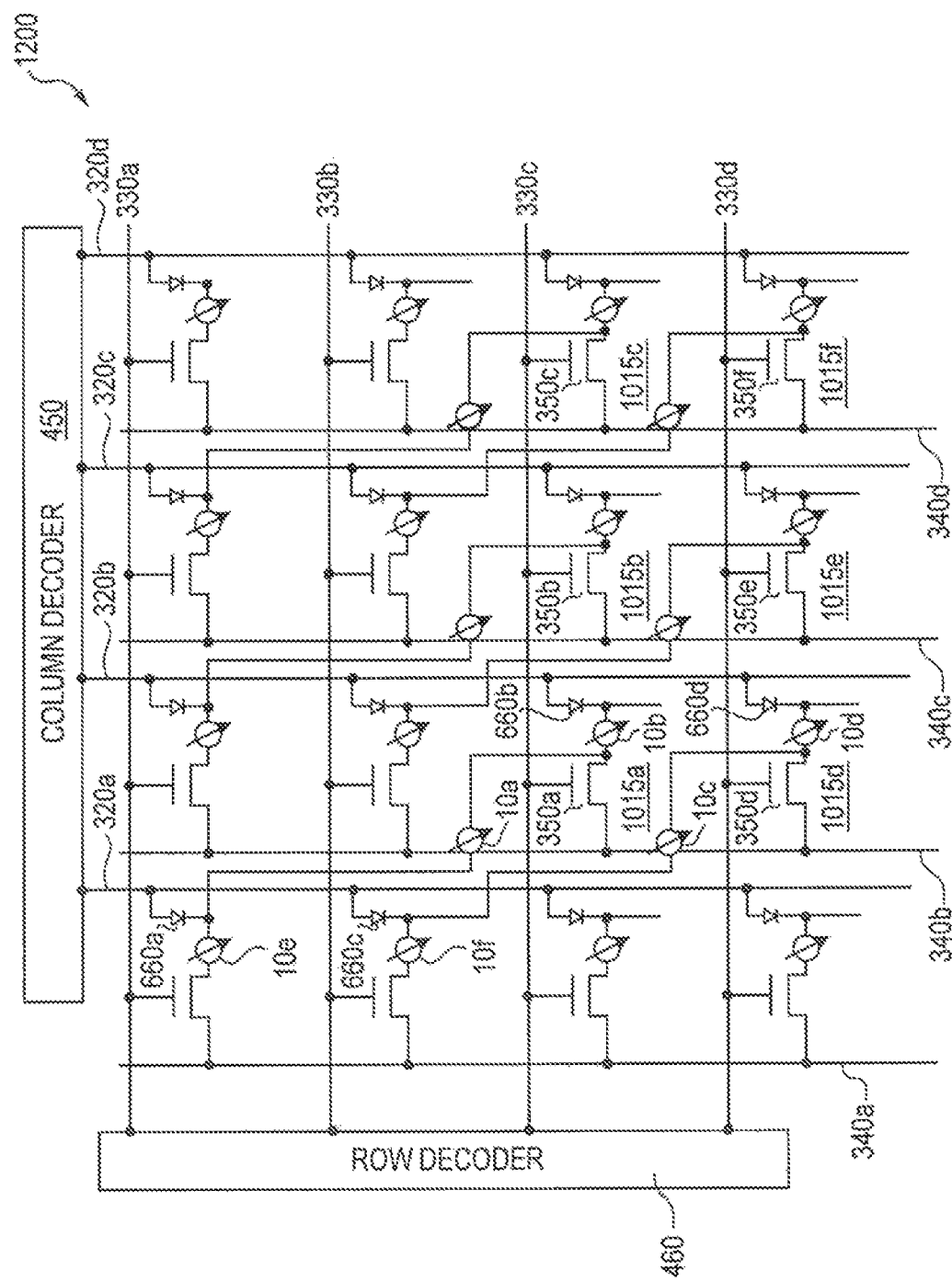
Figure 10B:
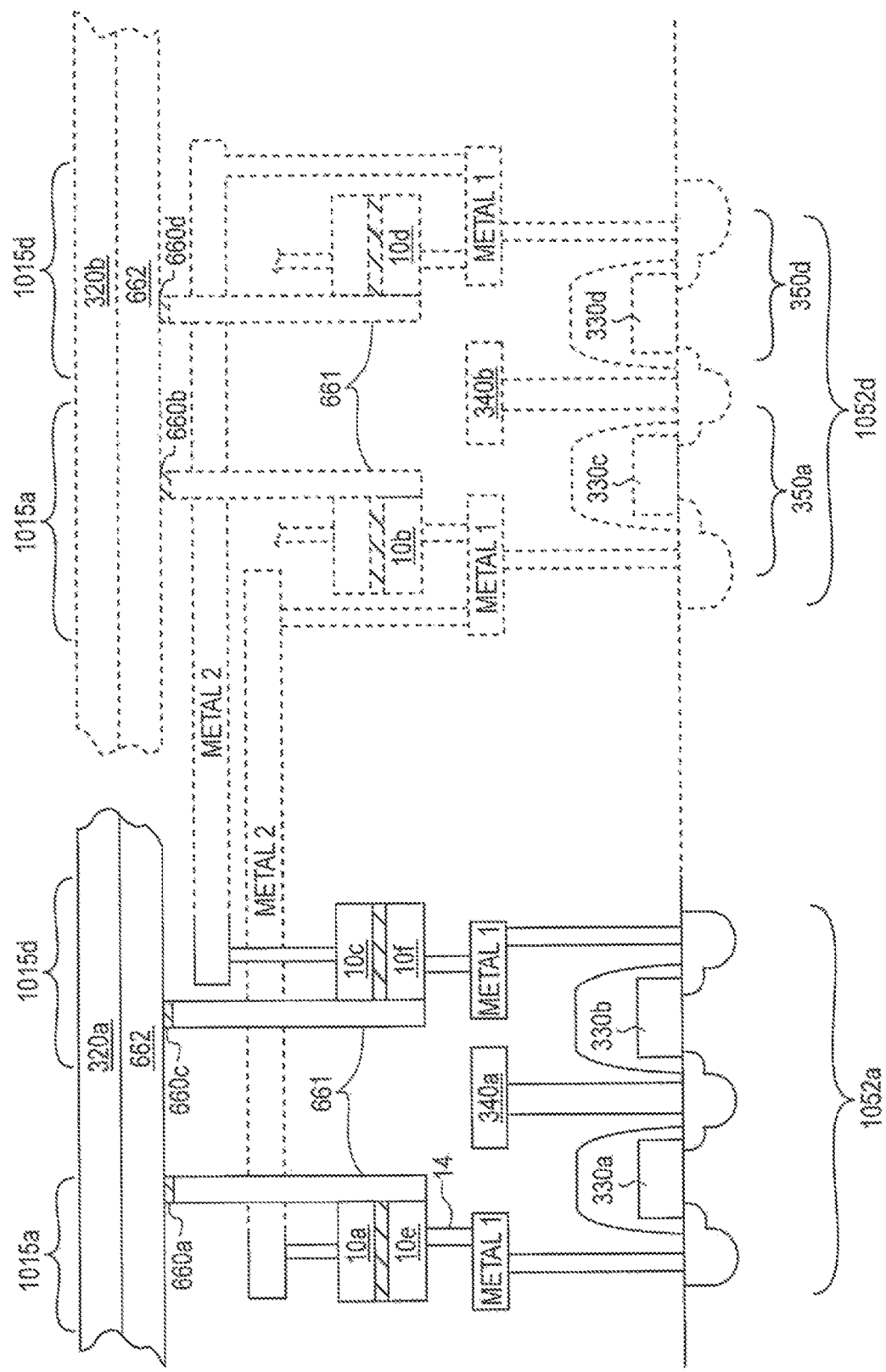

FIG. 10A depicts a memory device 1200 that includes a parallel arrangement of memory bit structures 1015a-1015f, organized in a way that only two memory cells are coupled to a rectifying device. Device 1200 makes this possible by spacing the two memory cells controlled by the same access device at least two access devices apart, as illustrated in FIGS. 10A and 10C. FIG. 10B depicts a cross-sectional view of the physical structure of two memory bit structures 1015a, 11015d from device 1200. FIG. 10C depicts the top-down view of the structures in FIG. 10B. In each of these figures, a memory cell 10a-10d shares a rectifying device 660a-660d with one other memory cell. For example, memory cell 10a shares rectifying device 660a with another memory cell 10e upon which memory cell 10a is stacked. Memory cell 10c also shares access device 350d with memory cell 10d. Long metal interconnects (metal 1 and 2) connect remote memory cells 10a and 10c to the access devices 350a and 350d, respectively. The metal interconnects (metal 1 and 2) make it possible to distribute portions of the memory bit structure 1015a, 1015d to distant active areas (e.g., 1052a). Effectively, the device 1200 combines the benefits of a staggered active area layout with the compactness of a parallel active area layout. In device 1200, individual bit lines 340a-340d may be individually addressed accordingly to the cell to be selected.

Figure 15A:
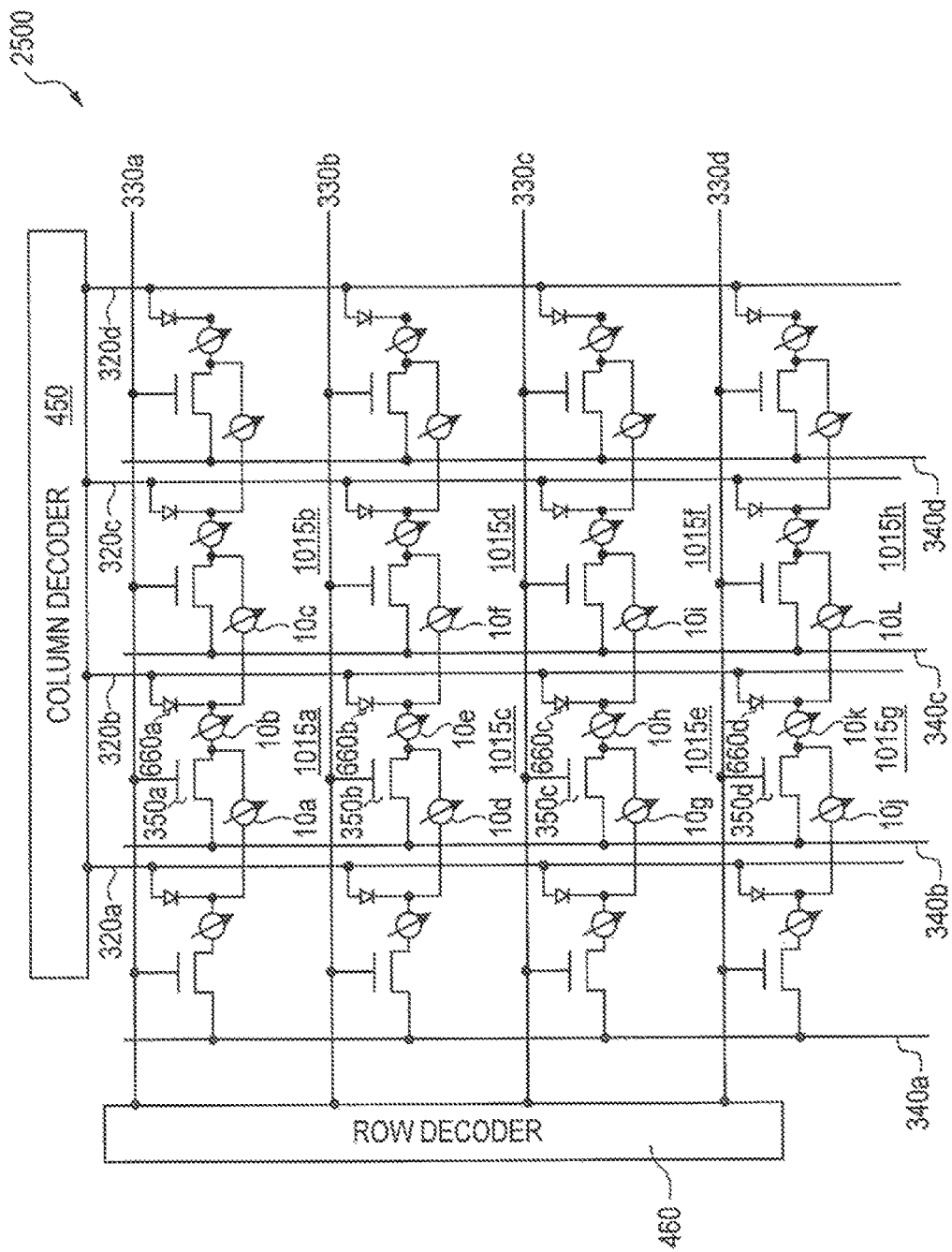
FIGS. 15A, 15B and 15C are schematic and physical representations of a phase change memory bit structure and a corresponding memory device according to a disclosed embodiment.
Figure 15B:
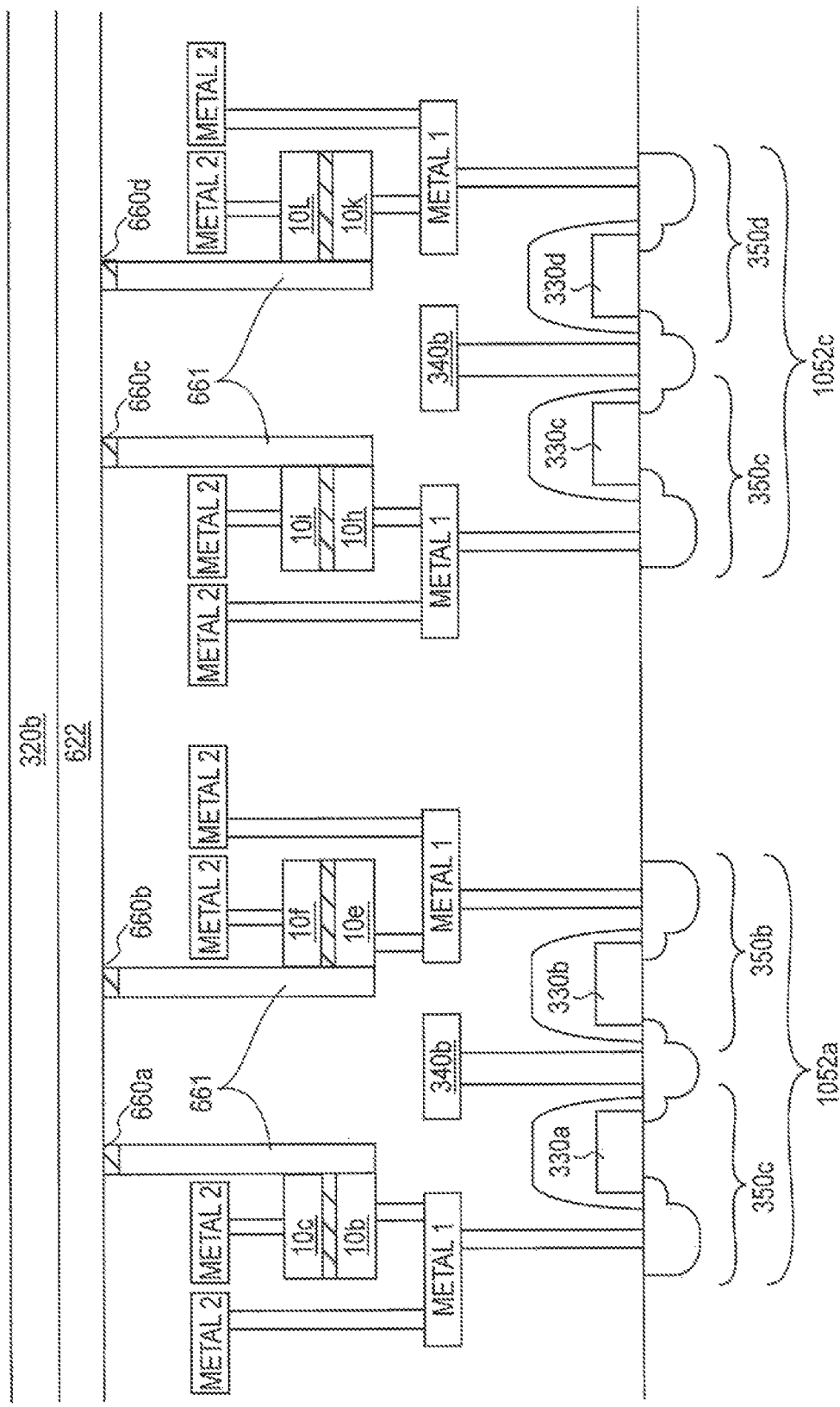
Figure 15C:
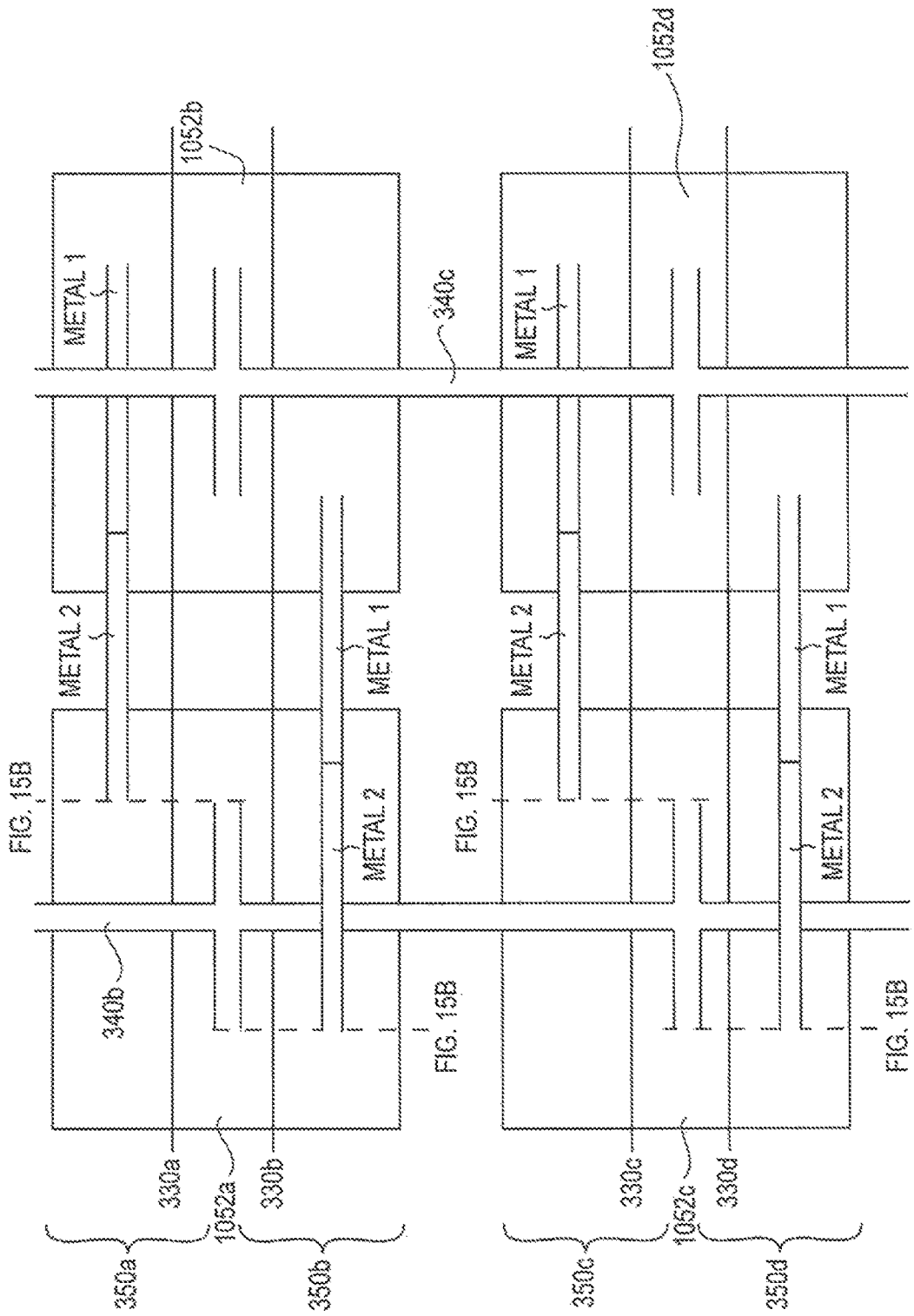

FIG. 15A represents a memory device 2500 that is similar to memory device 1200 of FIG. 10A. FIGS. 15B and 15C represent the corresponding organization and arrangement of memory device 2500. In memory device 2500, more than one memory cell shares the same cell select line and word line. For example, in FIG. 15A, memory bit structures 1015a and 1015b include memory cells 10b, 10c, respectively (among others). Both memory cells 10b, 10c are activated by utilizing cell select line 320b and word line 330a. As a result, memory cell selection requires that the bit lines 340b, 340c be individually addressed. For example, memory cell 10b is selected by activating the word line 330a and the cell select line 320b, and by appropriately biasing the bit line 340b. Similarly, memory cell 10c is selected by activating word line 330a and cell select line 320b, and by appropriately biasing the bit line 340c.

Figure 11A:
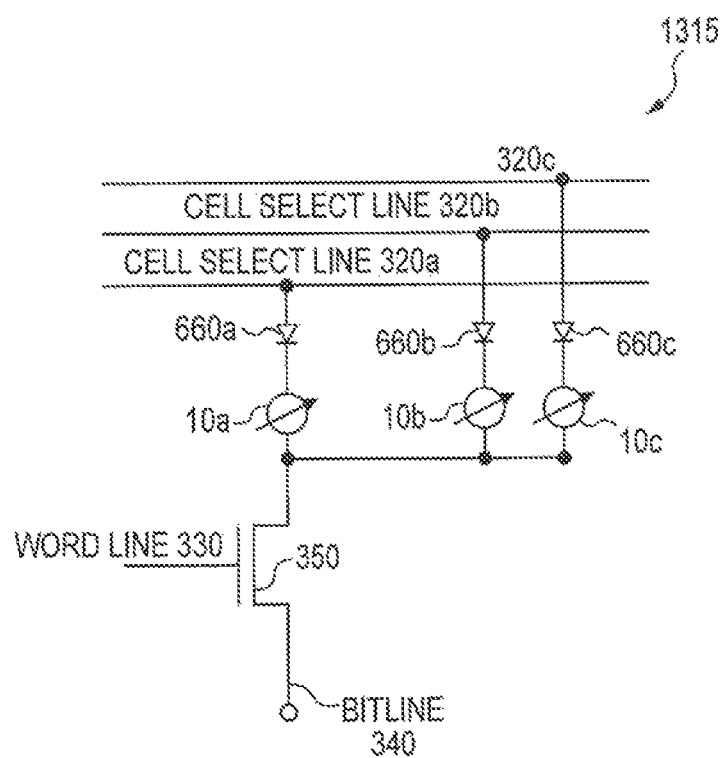
Figure 11B:
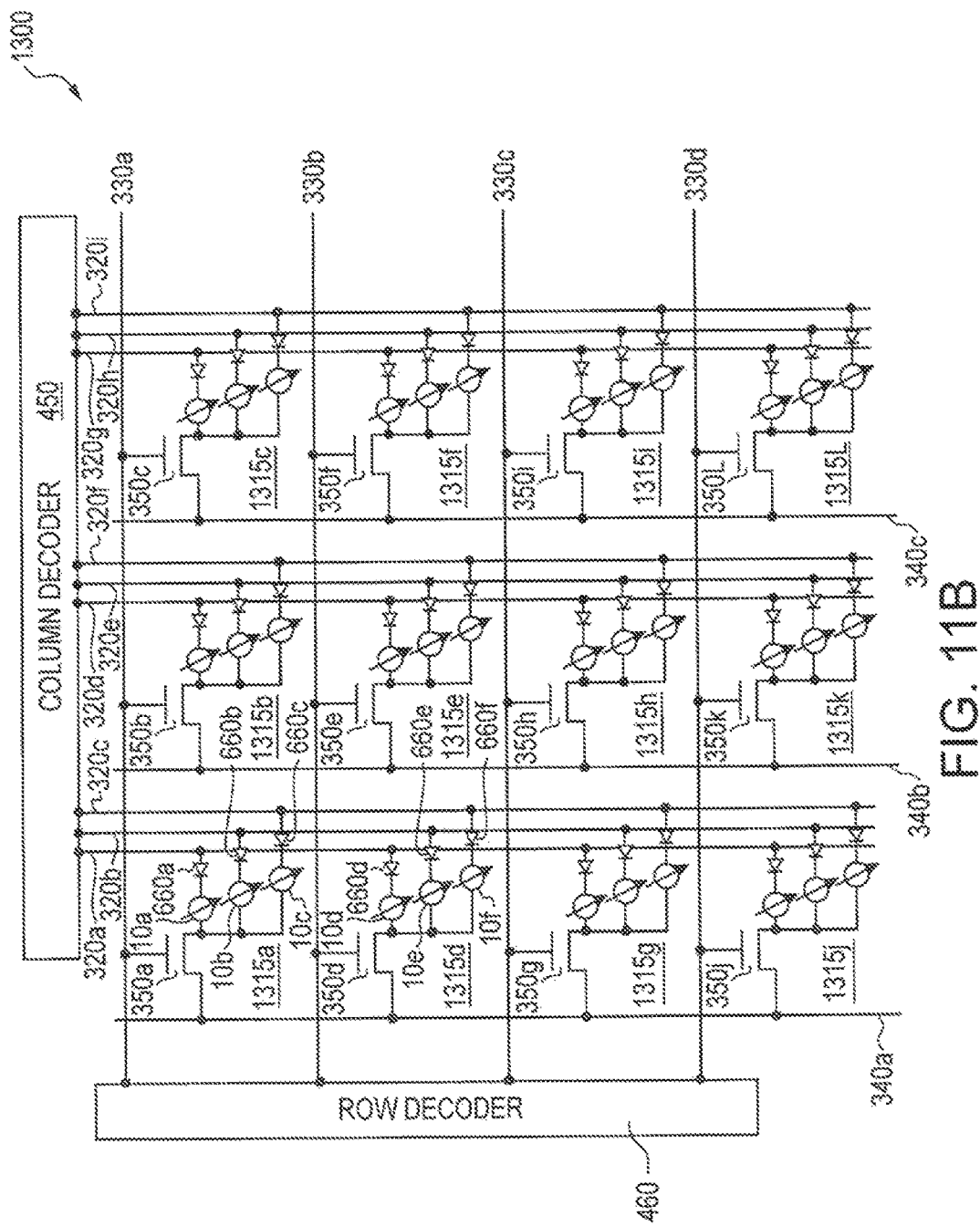

The general concepts discussed above can be applied to more complex memory bit structures. For example, in FIG. 11A, the concepts of memory bit structures 615 (FIGS. 3) and 1015 (FIG. 8A) are extended to a one access device/three memory cell memory bit structure 1315. In structure 1315, the rectifying devices 660a-660c are connected in between the memory cells 10a-10c and their respective cell select lines 320a-320c. In this way, a single access device 350 may control three memory cells 10a-10c. In fact, a single access device 350 could control access to as many memory cells as desired using the same basic layout shown in FIG. 11A. The memory bit structure 1315 may be arranged in a memory device 1300, as represented in FIG. 11B. In FIG. 11B, a cell select line 320a-320i exists for each memory cell in the memory bit structure 1315a-1315l. Although each memory bit structure 1315a-1315l in device 1300 only depicts three memory cells, as many memory cells as desired may be added with corresponding cell select lines.

Figure 11C:
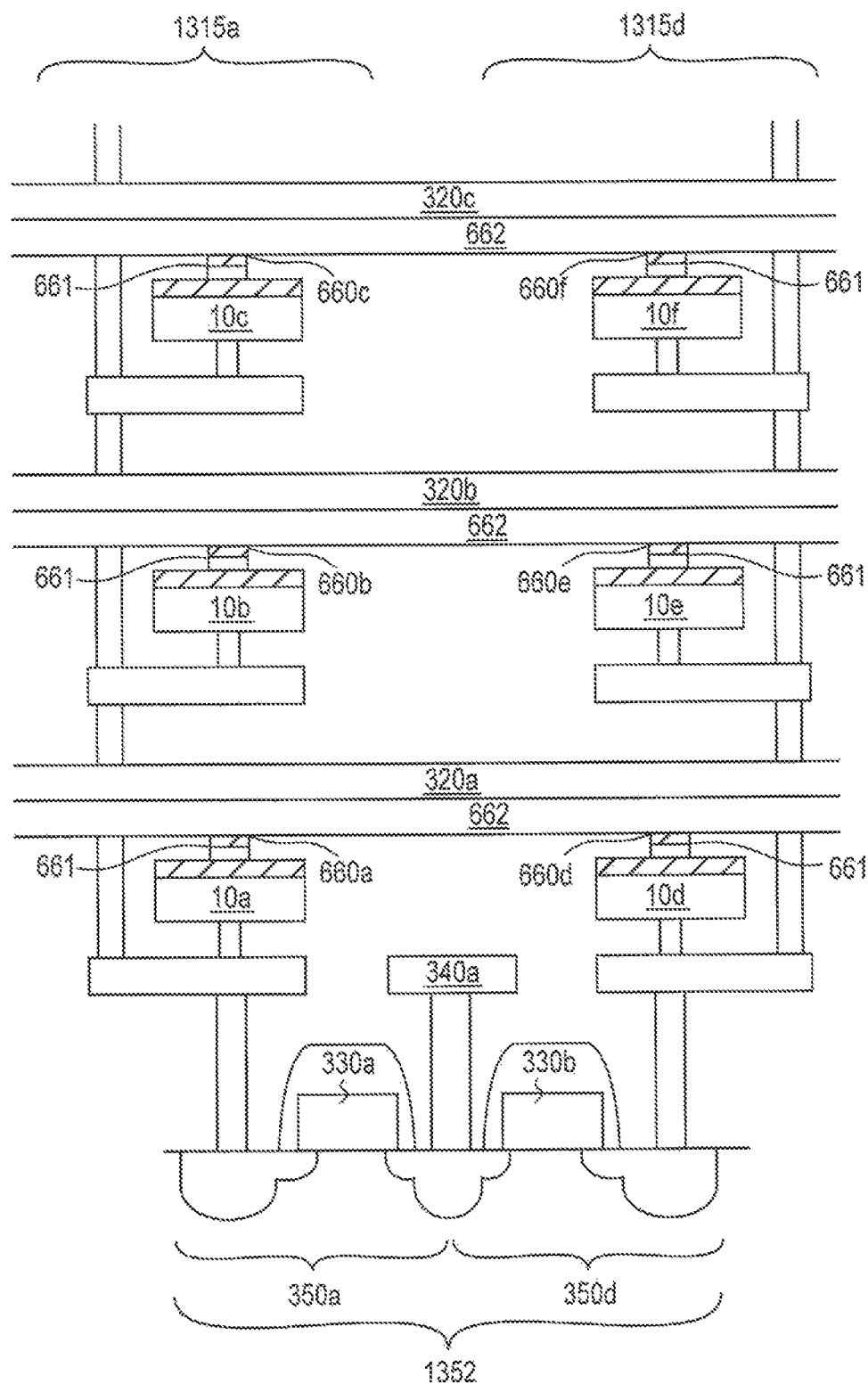

FIG. 11C depicts one possible method of physically arranging the memory bit structures 1315a, 1315d. For example, in FIG. 11C, word line 330a is used to activate access device 350a, thereby coupling bit line 340a to the bottom electrodes of memory cells 10a through 10x, where 'x' represents any letter of the alphabet. Each memory cell's top electrode is also coupled to a cell select line (e.g., 320a-320x) via a rectifying device (e.g., 660a-660x). Memory cell 10a is connected to cell select line 320a. Memory cell 10x is connected to cell select line 320x. The memory bit structures 1315a, 1315d illustrated in in FIG.

11C are also shown in a top-down view in FIG. 11D, In FIG. 11D, it is apparent that a pair of the memory bit structures (e.g., 1315*a*, 1315*d*) are staggered onto a single active area 1052. In this way, as many memory cells as desired may be located above a single active area 1052 and access device 350*a*, 350*d*.

Each of the improved phase change memory devices 700-1300 improves the spatial efficiency of phase change memory bit structures by utilizing only one access device for multiple memory cells. Spatial efficiency is also improved by stacking memory cells on top of each other and by sharing rectifying devices between memory cells. A parallel arrangement of memory bit structures also results in improved spatial efficiency.

Figure 12:
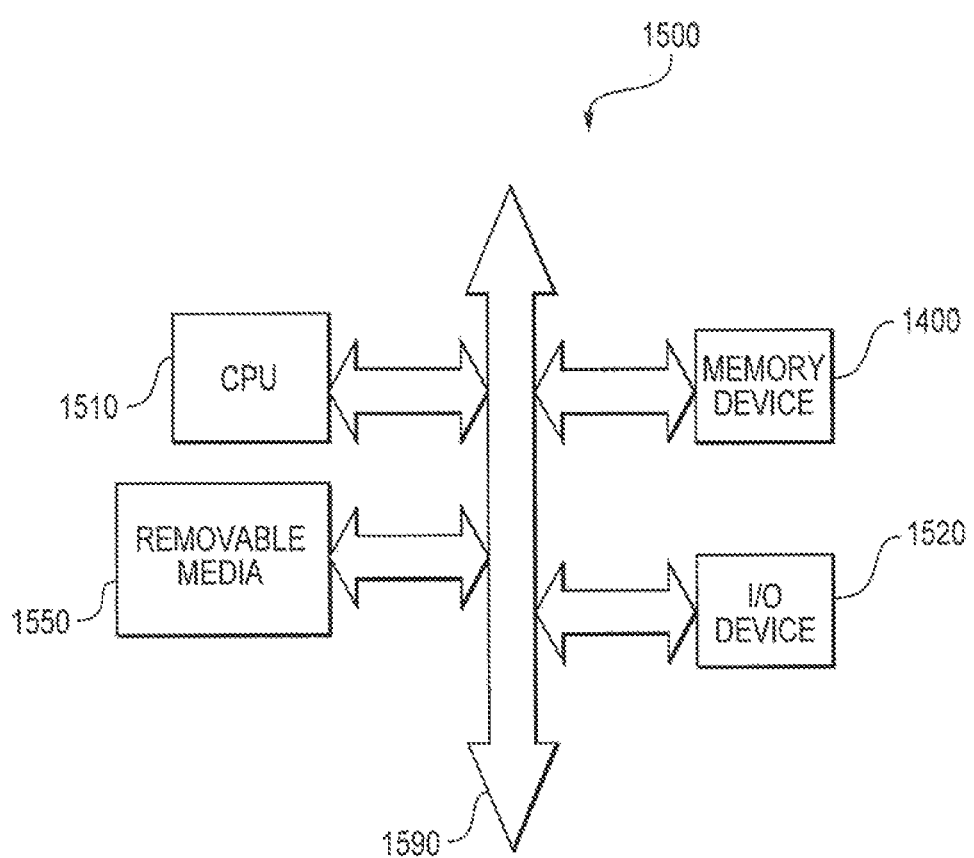
FIG. 12 illustrates a processor system that includes a memory device according to a disclosed embodiment.

It should be appreciated that the improved phase change memory devices 700-1300 may be fabricated as part of an integrated circuit. The corresponding integrated circuits may be utilized in a typical processor system. For example, FIG. 12 illustrates a simplified processor system 1500 which includes a memory device 1400 employing improved phase change memory bit structures such as structures 615, 1015 and 1315 in accordance with the above described embodiments. A processor system, such as a computer system, generally comprises a central processing unit (CPU) 1510, such as a microprocessor, a digital signal processor, or other programmable digital logic devices, which communicates with an input/output (I/O) device 1520 over a bus 1590. The memory device 1400 communicates with the CPU 1510 over bus 1590 typically through a memory controller.

In the case of a computer system, the processor system 1500 may include peripheral devices such as removable media devices 1550 (e.g., CD-ROM drive or DVD drive) which communicate with CPU 1510 over the bus 1590. Memory device 1400 is preferably constructed as an integrated circuit, which includes one or more phase change memory devices. If desired, the memory device 1400 may be combined with the processor, for example CPU 1510, as a single integrated circuit.

It should also be appreciated that various embodiments have been described as using a phase change material as an exemplary resistance variable material. The invention may also be used in other types of resistive memory to improve current flow through whatever resistance variable material is used.

The above description and drawings should only be considered illustrative of exemplary embodiments that achieve the features and advantages described herein. Modification and substitutions to specific process conditions and structures can be made. Accordingly, the invention is not to be considered as being limited by the foregoing description and drawings, but is only limited by the scope of the appended claims.

What is claimed is:

1. A method, comprising:
   forming an access device;
   depositing one or more dielectrics based at least in part on forming the access device;
   etching a via through the one or more dielectrics to the access device;
   doping a bottom of the via;
   applying a first annealing process to the bottom of the via after doping the bottom of the via;
   depositing a first material in the via after applying the first annealing process at the bottom of the via;
   depositing a second material in the via after depositing the first material;
   forming a third material from the first material and the second material by applying a second annealing process to the first material and the second material; and
   forming one or more contacts after forming the third material.

2. The method of claim 1, further comprising:
   diffusing p-doped material at the bottom of the via using the first annealing process, wherein depositing the first material occurs after diffusing the p-doped material.

3. The method of claim 1, wherein the via extends at least partially into a drain of the access device.

4. The method of claim 1, further comprising:
   forming an n-doped drain of the access device by doping a material with arsenic or phosphorous; and
   forming a gate of the access device.

5. The method of claim 1, further comprising:
   removing at least some deposits of the one or more dielectrics using a chemical-mechanical polishing process.

6. The method of claim 1, wherein the first material comprises titanium, the second material comprises titanium nitride, and the third material comprises titanium silicide.

7. The method of claim 1, wherein the one or more contacts are tungsten contacts formed using a tungsten chemical-mechanical polishing process.

\* \* \* \* \*